(12) United States Patent
Shinohara

(10) Patent No.: US 12,592,540 B2
(45) Date of Patent: Mar. 31, 2026

(54) SEMICONDUCTOR LASER AND SEMICONDUCTOR LASER DEVICE

(71) Applicant: Mitsubishi Electric Corporation, Tokyo (JP)

(72) Inventor: Kosuke Shinohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 701 days.

(21) Appl. No.: 17/998,758

(22) PCT Filed: Sep. 4, 2020

(86) PCT No.: PCT/JP2020/033527
§ 371 (c)(1),
(2) Date: Nov. 14, 2022

(87) PCT Pub. No.: WO2022/049714
PCT Pub. Date: Mar. 10, 2022

(65) Prior Publication Data
US 2023/0198222 A1 Jun. 22, 2023

(51) Int. Cl.
*H01S 5/0237* (2021.01)
*H01S 5/023* (2021.01)
(Continued)

(52) U.S. Cl.
CPC ............ *H01S 5/0237* (2021.01); *H01S 5/023* (2021.01); *H01S 5/0234* (2021.01); *H01S 5/04256* (2019.08)

(58) Field of Classification Search
CPC .. H01S 5/0234; H01S 5/0237; H01S 5/04254; H01S 5/04256
See application file for complete search history.

(56) References Cited

U.S. PATENT DOCUMENTS 5,729,561 A * 3/1998 Hironaka ................ H01L 24/32
372/36
5,949,808 A * 9/1999 Fujihara .............. H01S 5/02476
372/46.01
(Continued)

FOREIGN PATENT DOCUMENTS

JP H02-72573 U 6/1990
JP H05-13820 A 1/1993
(Continued)

OTHER PUBLICATIONS

An Office Action; mailed by the China National Intellectual Property Administration of the People's Republic of China on Sep. 4, 2024, which corresponds to Chinese Patent Application No. 202080103462.X.
(Continued)

*Primary Examiner* — James A Menefee
(74) *Attorney, Agent, or Firm* — Studebaker Brackett PLLC

(57) ABSTRACT

A semiconductor laser comprises: a semiconductor substrate; a semiconductor structure part that is formed on the substrate; a surface electrode formed on the structure part opposite to the substrate; and a conductive member formed on the surface electrode opposite to the substrate. The conductive member is such that part of or the whole of a side face thereof on an emission facet side, the side face being one side face in an x-direction parallel to an extending direction of an active layer, is formed to be away from an emission facet in the structure part toward a side of the other facet opposed to the emission facet in the x-direction. In the semiconductor laser, a receding portion is formed such that at least part of the conductive member recedes toward the side of the other facet in the x-direction from the emission facet.

25 Claims, 20 Drawing Sheets

(51) Int. Cl.
 *H01S 5/0234*  (2021.01)
 *H01S 5/042*   (2006.01)

(56)    References Cited

U.S. PATENT DOCUMENTS

| | | | | |
|---|---|---|---|---|
| 2003/0151059 | A1 * | 8/2003 | Wakisaka | H01L 24/32 |
| | | | | 438/22 |
| 2003/0152119 | A1 * | 8/2003 | Oozeki | H01S 5/02326 |
| | | | | 372/36 |
| 2005/0141579 | A1 | 6/2005 | Yamane et al. | |
| 2005/0232324 | A1 * | 10/2005 | Terada | H01S 5/22 |
| | | | | 372/46.01 |

FOREIGN PATENT DOCUMENTS

| | | | |
|---|---|---|---|
| JP | H05-67847 | A | 3/1993 |
| JP | 2005-191209 | A | 7/2005 |
| JP | 2013-115240 | A | 6/2013 |

OTHER PUBLICATIONS

International Search Report issued in PCT/JP2020/033527; mailed Nov. 24, 2020.

* cited by examiner

FIG. 4
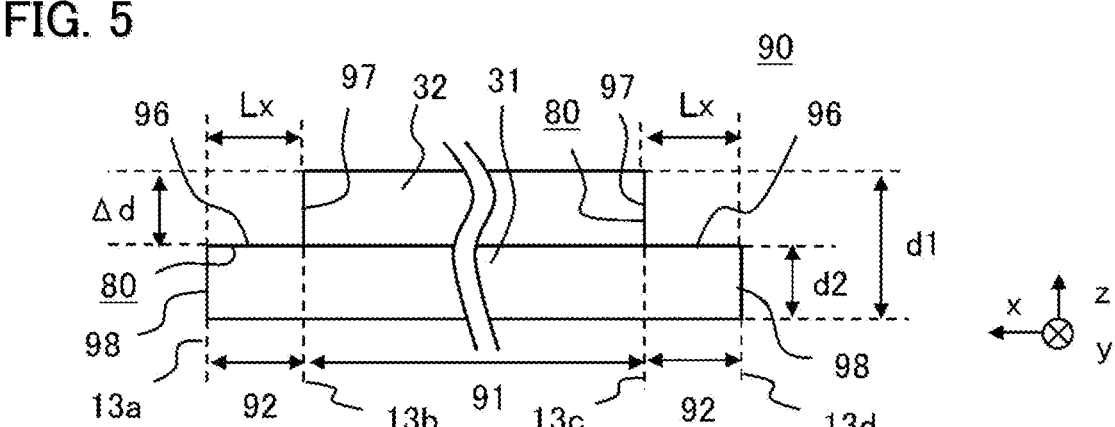
FIG. 5
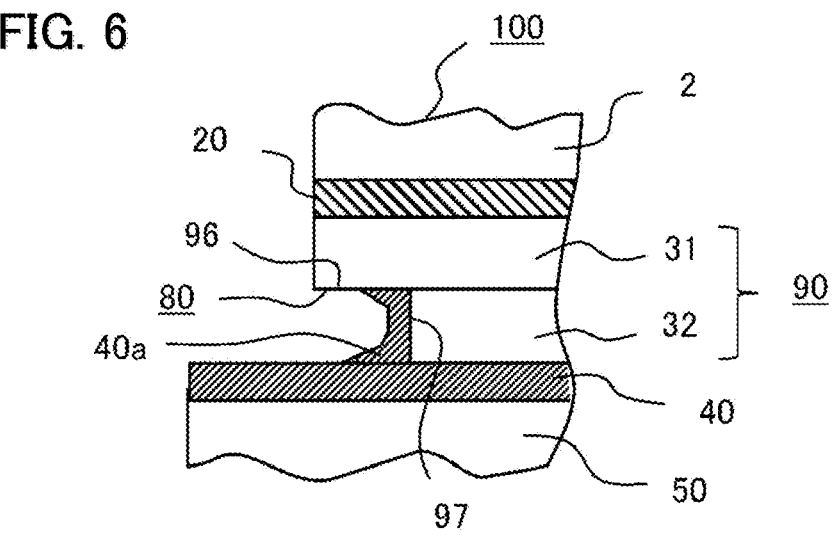
FIG. 6

FIG. 11
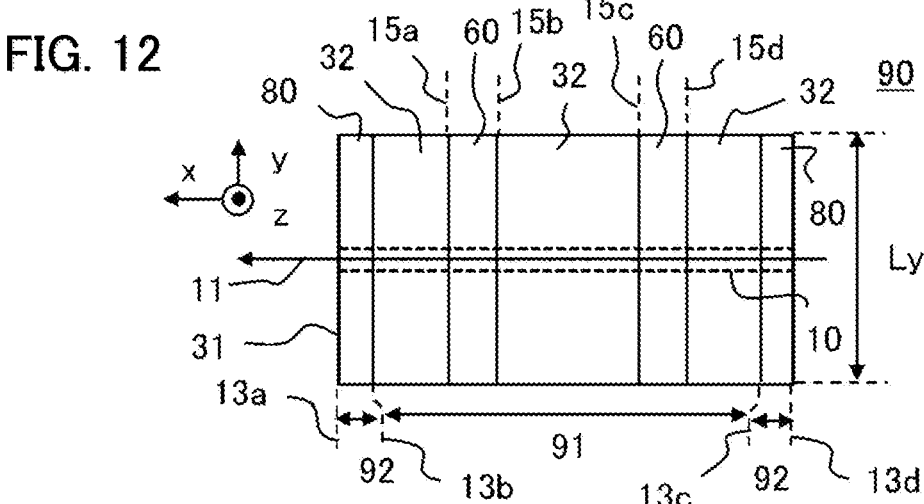
FIG. 12
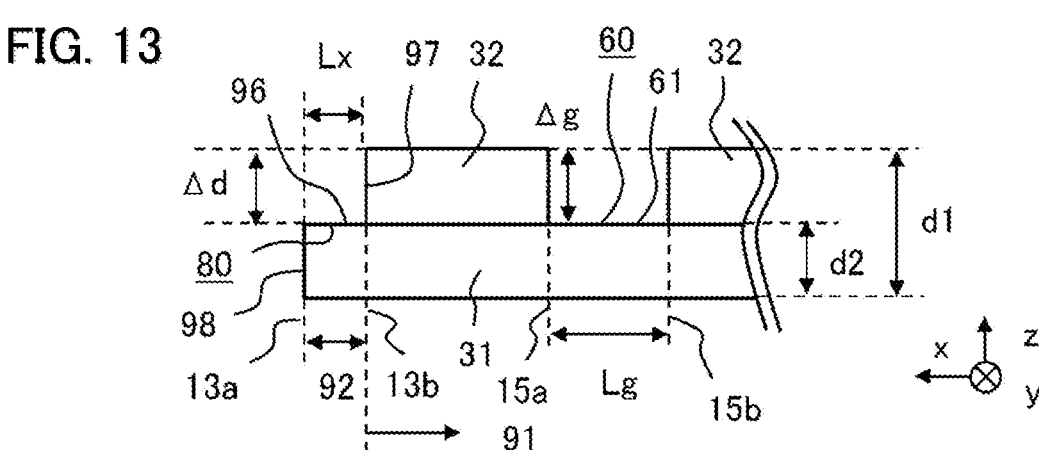
FIG. 13

FIG. 14
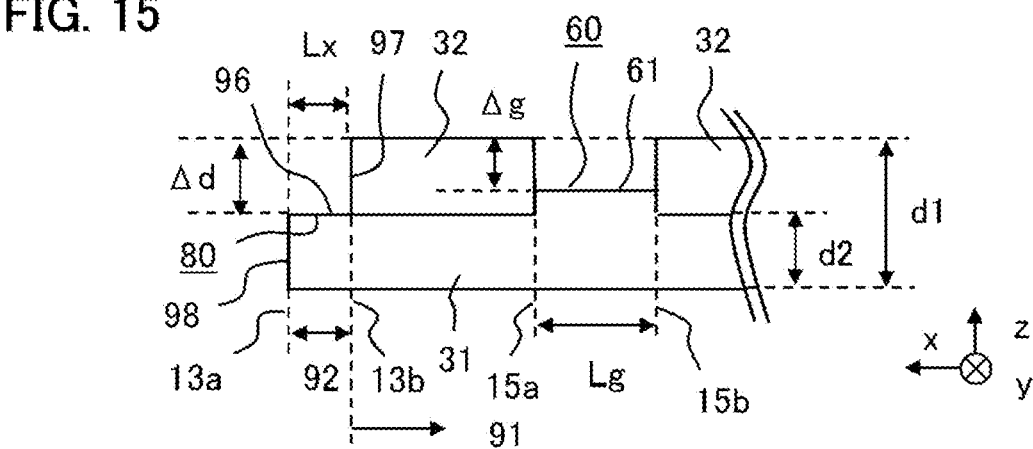
FIG. 15
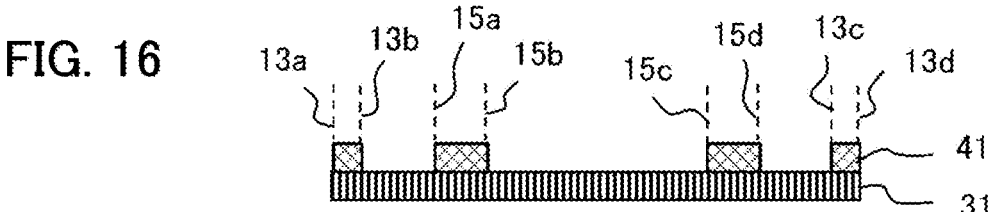
FIG. 16
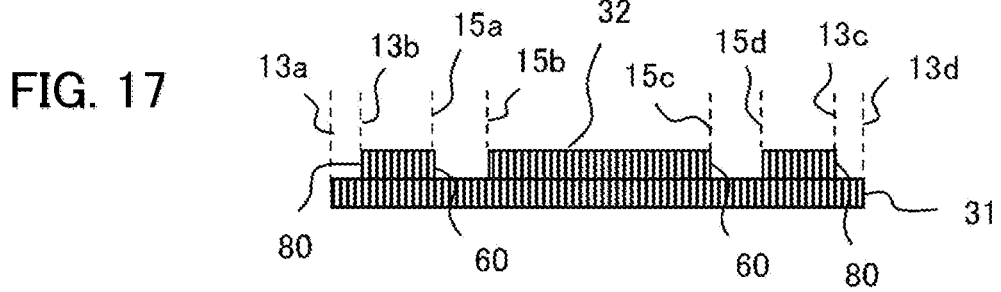
FIG. 17

FIG. 23
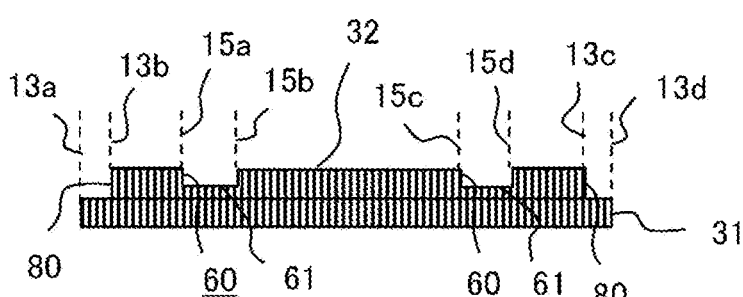
FIG. 24
FIG. 25
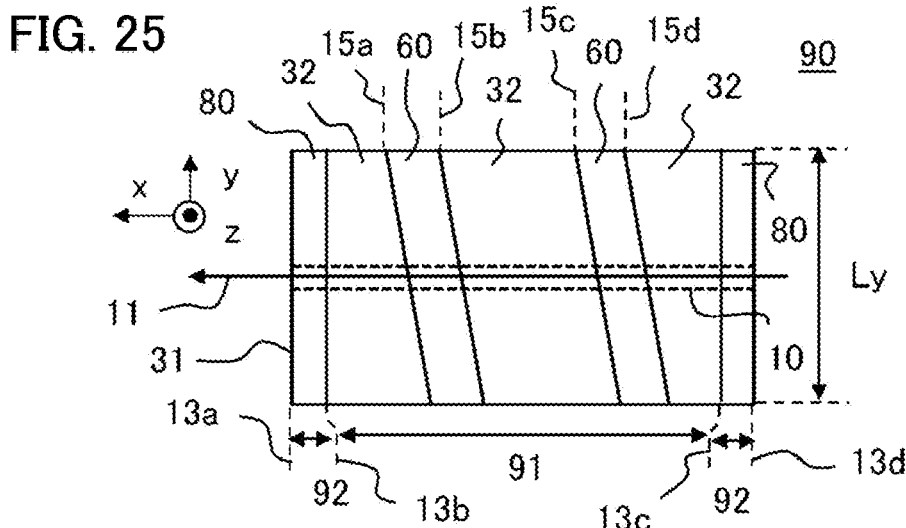

FIG. 39
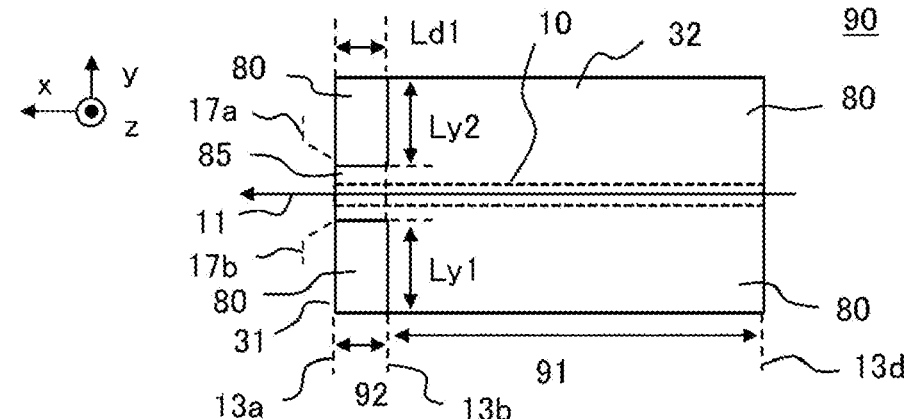
FIG. 40
FIG. 41
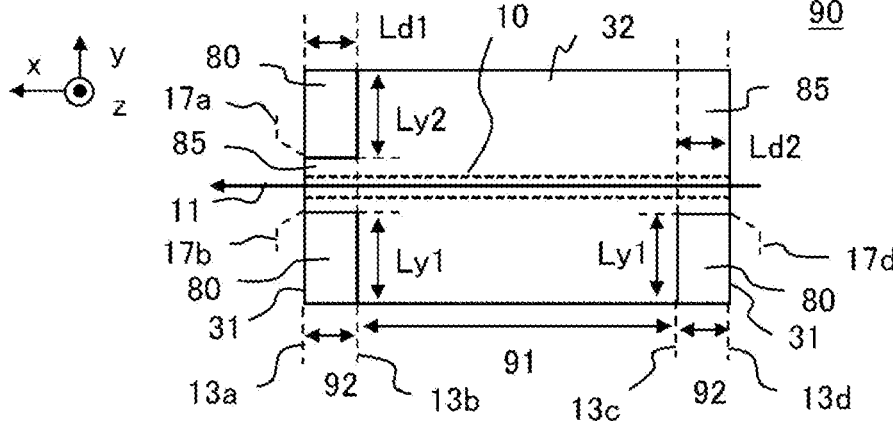

FIG. 51
FIG. 52
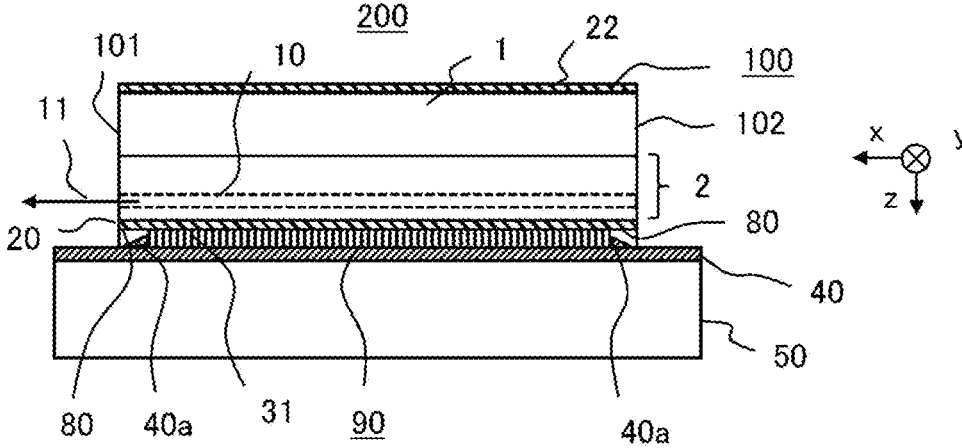
FIG. 53
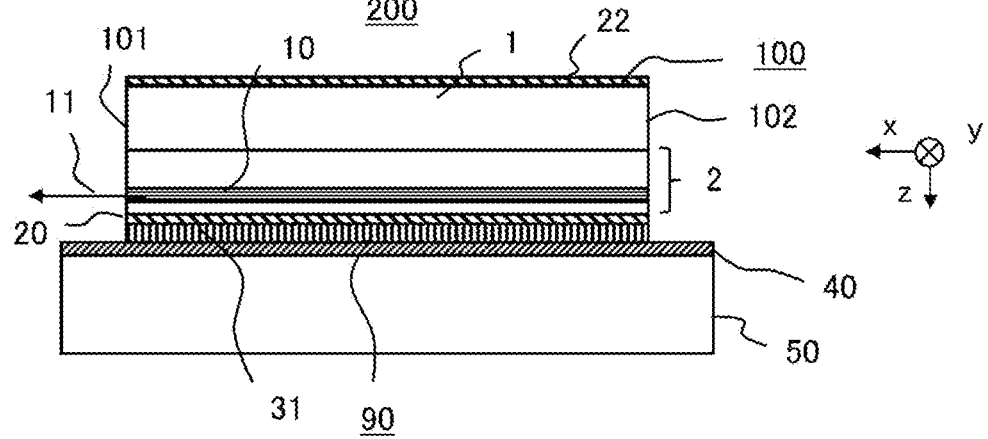

FIG. 56

SEMICONDUCTOR LASER AND SEMICONDUCTOR LASER DEVICE

TECHNICAL FIELD

The present application relates to a semiconductor laser.

BACKGROUND ART

When a semiconductor laser chip having an epitaxial layer including a pn junction formed on a semiconductor substrate is mounted on a submount, so-called junction-down mounting or epitaxial-side-down mounting may be performed in which the semiconductor laser chip is mounted such that the pn junction thereof faces the submount. Patent Document 1 discloses a mounting method in which a copper plating layer is interposed between a submount and a semiconductor laser in order to prevent short-circuit failure due to contact of a solder material with an end of a pn junction surface exposed on a light emission facet when a semiconductor laser is junction-down mounted.

CITATION LIST

Patent Document

Patent Document 1: Japanese Patent Application Publication Laid-open No. H05-13820 (FIG. 1, FIG. 3)

SUMMARY OF INVENTION

Problems to be Solved by Invention

When a semiconductor laser in which an active layer is formed between a p-type cladding layer and an n-type cladding layer is junction-down mounted, there is a case where a bonding member such as a solder material comes around a light emission facet to cover the active layer and the emission light is blocked, and thus a sufficient light output cannot be obtained. In the mounting method disclosed in Patent Document 1, the thickness of the copper plating layer formed on the submount is set so that the solder material does not come around the end of the pn junction surface exposed on the light emission facet. In the mounting method disclosed in Patent Document 1, it is necessary to use a submount having a copper plating layer in a different size, that is, a different area and a thickness, depending on the dimension of the semiconductor laser to be mounted. In a case where the submount is procured from outside, it is not easy to change patterns of submount wiring, the copper plating layer, and the like, which may lead to affect the design and manufacture of the semiconductor laser.

A technique disclosed in the specification of the present application aims to provide a semiconductor laser in which a bonding member does not come around the light emission facet at the time of junction down mounting.

Means for Solving Problems

A semiconductor laser of one example disclosed in the specification of the present specification includes a semiconductor substrate, a semiconductor structure part that is formed on a surface of the semiconductor substrate and includes an active layer for generating light emitted from an emission facet, a surface electrode formed on a surface of the semiconductor structure part opposite to the semiconductor substrate, and a conductive member formed on a surface of the surface electrode opposite to the semiconductor substrate. The conductive member is such that part of or the whole of a side face thereof on an emission facet side, the side face being one side face in an x-direction parallel to an extending direction in which the active layer extends, is formed to be away from the emission facet in the semiconductor structure part toward a side of the other facet opposed to the emission facet in the x-direction. A receding portion is formed such that at least part of the conductive member recedes toward the side of the other facet in the x-direction from the emission facet.

Effect of Invention

In the semiconductor laser of one example disclosed in the specification of the present application, since a receding portion is formed in which at least part of a side face of the conductive member on the emission facet side recedes from the emission facet to the other facet side in the x-direction, it is possible to prevent the bonding member from coming around the light emission facet at the time of junction down mounting.

BRIEF DESCRIPTION OF DRAWINGS

FIG. 4 is a plan view of a conductive member of FIG. 2.

FIG. 5 is a cross-sectional view showing a principal part of the conductive member of FIG. 2.

FIG. 6 is a cross-sectional view showing a principal part of another bonding portion between the conductive member and a bonding member of FIG. 1.

FIG. 11 is a perspective view of the semiconductor laser according to Embodiment 2.

FIG. 12 is a plan view of a conductive member of FIG. 11.

FIG. 13 is a cross-sectional view showing a principal part of a first example of the conductive member of FIG. 11.

FIG. 14 is a cross-sectional view showing a principal part of a second example of the conductive member of FIG. 11.

FIG. 15 is a cross-sectional view showing a principal part of a third example of the conductive member of FIG. 11.

FIG. 16 is a diagram for explaining a method of forming the first example of the conductive member according to Embodiment 2.

FIG. 17 is a diagram for explaining a method of forming the first example of the conductive member according to Embodiment 2.

FIG. 23 is a diagram for explaining the method of forming the third example of the conductive member according to Embodiment 2.

FIG. 24 is a plan view showing a fourth example of the conductive member according to Embodiment 2.

FIG. 25 is a plan view showing a fifth example of the conductive member according to Embodiment 2.

FIG. 36 is a cross-sectional view including a cross section of receding portions in the semiconductor laser and a semiconductor laser device according to Embodiment 5.

FIG. 37 is a cross-sectional view including a cross section of a tip main part of the semiconductor laser and the semiconductor laser device according to Embodiment 5.

FIG. 38 is a plan view showing a first example of the conductive member of FIG. 35.

FIG. 39 is a plan view showing a second example of the conductive member of FIG. 35.

FIG. 40 is a plan view showing a third example of the conductive member of FIG. 35.

FIG. 41 is a plan view showing a fourth example of the conductive member of FIG. 35.

FIG. 51 is a plan view showing a fourth example of the semiconductor laser according to Embodiment 6.

FIG. 52 is a cross-sectional view including a cross section of receding portions in the fourth example of the semiconductor laser and the semiconductor laser device according to Embodiment 6.

FIG. 53 is a cross-sectional view including a cross section of a tip main part in the fourth example of the semiconductor laser and the semiconductor laser device according to Embodiment 6.

FIG. 56 is a plan view of the semiconductor laser of FIG. 55.

MODES FOR CARRYING OUT INVENTION

Embodiment 1

Figure 1:
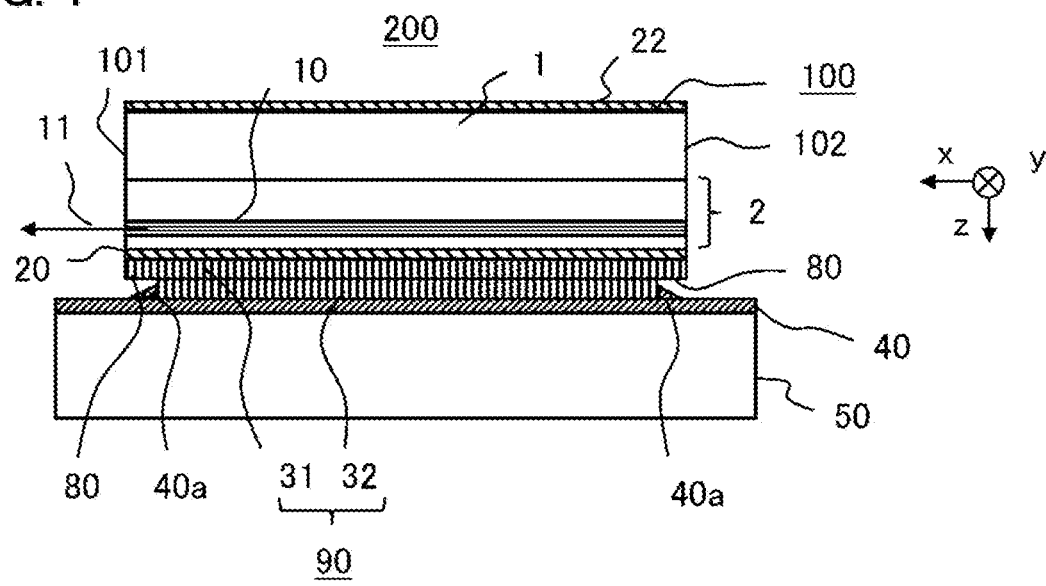
FIG. 1 is a cross-sectional view showing a first example of a semiconductor laser and a semiconductor laser device according to Embodiment 1.
Figure 2:
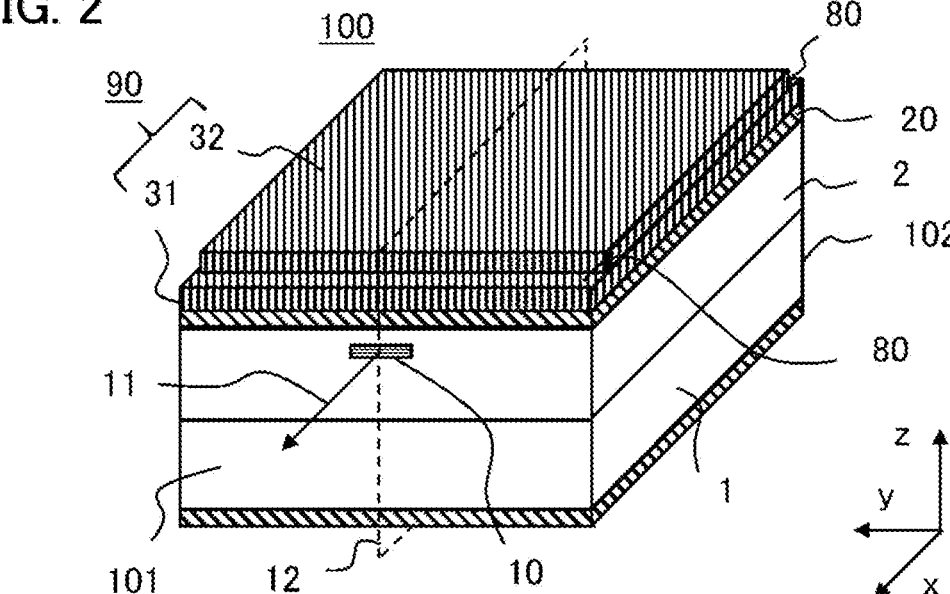
FIG. 2 is a perspective view of the first example of the semiconductor laser according to Embodiment 1.
Figure 3:
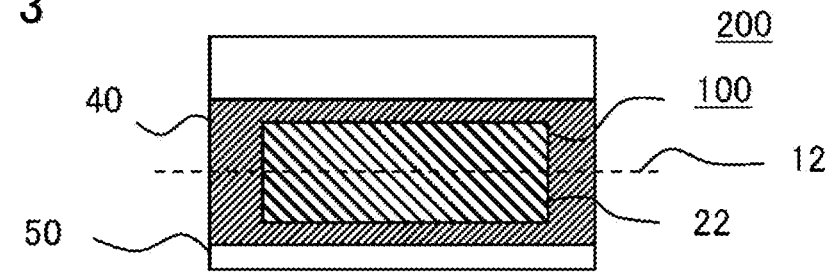
FIG. 3 is a top view of the semiconductor laser and the semiconductor laser device according to Embodiment 1.
Figures 7, 8:
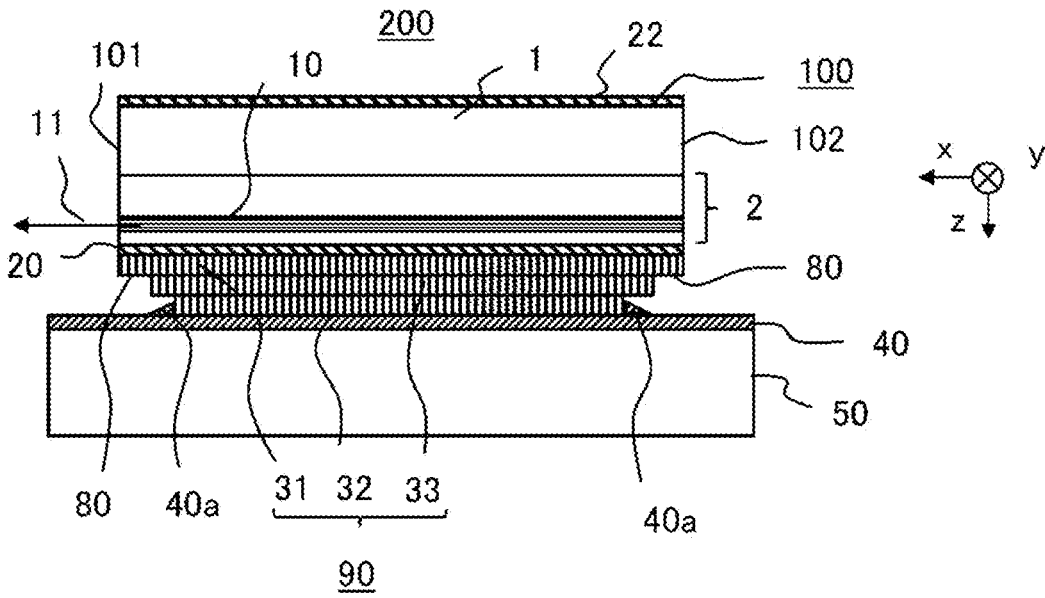
FIG. 7 is a cross-sectional view showing a second example of the semiconductor laser and the semiconductor laser device according to Embodiment 1.
FIG. 8 is a cross-sectional view showing a third example of the semiconductor laser and the semiconductor laser device according to Embodiment 1.
Figures 9, 10:
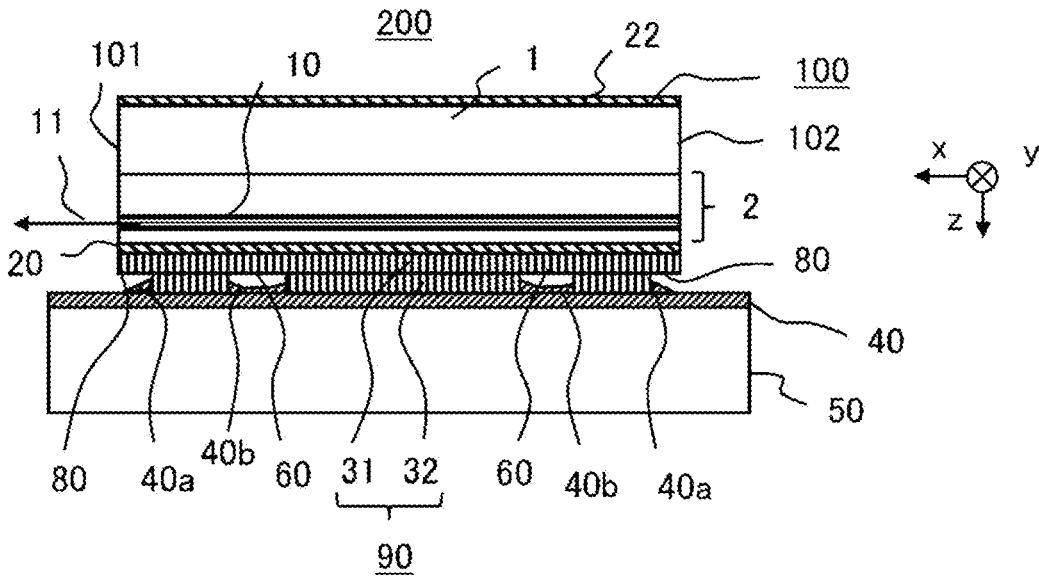
FIG. 9 is a cross-sectional view showing a principal part of a conductive member of FIG. 8.
FIG. 10 is a cross-sectional view showing a semiconductor laser and a semiconductor laser device according to Embodiment 2.

FIG. 1 is a cross-sectional view showing a first example of a semiconductor laser and a semiconductor laser device according to Embodiment 1, and FIG. 2 is a perspective view of the first example of the semiconductor laser according to Embodiment 1. FIG. 3 is a top view of the semiconductor laser and the semiconductor laser device according to Embodiment 1. FIG. 4 is a plan view of a conductive member of FIG. 2, and FIG. 5 is a cross-sectional view showing a principal part of the conductive member of FIG. 2. FIG. 6 is a cross-sectional view showing a principal part of another bonding portion between the conductive member and a bonding member of FIG. 1. FIG. 7 is a cross-sectional view showing a second example of a semiconductor laser and a semiconductor laser device according to Embodiment 1. FIG. 8 is a cross-sectional view showing a third example of the semiconductor laser and the semiconductor laser device according to Embodiment 1, and FIG. 9 is a cross-sectional view showing a principal part of the conductive member of FIG. 8. A semiconductor laser 100 according to Embodiment 1 comprises a semiconductor substrate 1, a semiconductor structure part 2 that is formed on a surface of the semiconductor substrate 1 and includes an active layer 10 for generating light emitted from an emission facet, a first electrode 20 that is a surface electrode formed on a surface of the semiconductor structure part 2 opposite to the semiconductor substrate 1, a conductive member 90 formed on a surface of the first electrode 20 opposite to the semiconductor substrate 1, and a second electrode 22 that is a rear electrode formed on a rear surface of the semiconductor substrate 1. The cross-sectional view of the semiconductor laser device shown in FIG. 1 is a cross-sectional view taken along a fracture surface 12 shown in FIG. 3, and the cross-sectional view of the semiconductor laser 100 shown in FIG. 1 is a cross-sectional view taken along the fracture surface 12 shown in FIG. 2.

The semiconductor laser device 200 according to Embodiment 1 includes the semiconductor laser 100 and a submount 50 on which the semiconductor laser 100 is mounted, and the conductive member 90 of the semiconductor laser 100 is bonded to the submount 50 with the bonding member 40 such as a solder material. The semiconductor laser 100 emits light along an optical axis 11 from, for example, a front facet 101. The semiconductor laser 100 emits light from the front facet 101 along the optical axis 11 and may emit light from a rear facet 102 along the optical axis 11. In the optical axis 11, an arrow is attached in the direction in which light is emitted from the front facet 101. In the figures, a direction perpendicular to the semiconductor substrate 1 is a z-direction, a direction parallel to the extending direction in which the active layer 10 extends is an x-direction, and a direction perpendicular to the x-direction and z-directions is a y-direction.

The conductive member 90 is formed such that part thereof on the first electrode 20 side in both of the side faces in the x-direction parallel to the extending direction in which the active layer 10 extends, that is, part of the front facet 101 side and part of the rear facet 102 side, recede toward respective opposite facet sides, and receding portions 80 are formed in which at least part of the conductive member 90 recedes from the front facet 101 and the rear facet 102 in the semiconductor structure part 2 toward respective other facet sides in the x-direction. More specifically, the conductive member 90 is formed such that the part of the front facet 101 side thereof recedes away from the front facet 101 toward the rear facet 102 side, the front facet 101 being the emission facet in the semiconductor structure part 2, the rear facet 102 being the other facet opposite to the front facet 101, and the part of the rear facet 102 side thereof recedes away from the rear facet 102 toward the front facet 101 side in the semiconductor structure part 2, the front facet 101 being the other facet opposite to the rear facet 102. For this reason, in the conductive member 90, the receding portions 80 in which at least part of the conductive member 90 recedes from the front facet 101 and the rear facet 102 in the semiconductor structure part 2 toward the respective other facet sides in the x-direction are formed on the front facet 101 side and the rear facet 102 side. The receding portions 80 are also the portions where the thickness in the z-direction is reduced at the tip of the conductive member 90 on the positive side in the x-direction and at the tip of the conductive member 90 on the negative side in the x-direction. The portions where the thickness of the conductive member 90 is reduced in the z-direction can also be referred to as extended parts 92 extending from a main part 91. A portion between a broken line 13*b* and a broken line 13*c* is the main part 91, and portions between a broken line 13*a* and a broken line 13*b* and between a broken line 13*c* and a broken line 13*d* are the extended parts 92 and the receding portions 80. The broken lines 13*a* and 13*d* are broken lines along extended part side faces 98 of the extended parts 92, and the broken lines 13*b* and 13*c* are broken lines along main part side faces 97 in the main part 91.

In FIG. 1, FIG. 2, FIG. 4, and FIG. 5, a first example of the conductive member 90 is shown. The first example of the conductive member 90 includes, for example, a conductive layer 31 on the first electrode 20 side and a conductive layer 32 on the positive side in the z-direction with respect to the conductive layer 31. The receding portions 80 are the portions including the side faces of the conductive layer 32, that is, the main part side faces 97 being the side faces of the main part 91, and extended part surfaces 96 facing the submount 50 in the extended parts 92. The receding portions 80 of the conductive member 90 are formed on both facet sides of the semiconductor structure part 2 in the x-direction, that is, on the front facet 101 side and the rear facet 102 side, so as to include the extended part surfaces 96 that are the surfaces of the extended parts 92 opposite to the semiconductor substrate 1, and the main part side faces 97 of the main part 91 connected to the extended part surfaces 96. A length of the receding portion 80 in the x-direction is the same as an extension length Lx, which is the length of the extended part 92. The length of the receding portion 80 on the front facet 101 side in the x-direction is the length from the broken line 13*a* to the broken line 13*b*, and the length of the receding portion 80 on the rear facet 102 side in the x-direction is the length from the broken line 13*c* to the broken line 13*d*. A height of the receding portion 80 in the z-direction is the same as a step height Δd between the extended part surface 96, which is the surface of the conductive layer 31, and the surface of the conductive layer 32, and the same as the difference between a main part height d1, which is the height of the main part 91 in the z-direction, and an extended part height d2, which is the height of the extended part 92 in the z-direction. The height of the receding portion 80 in the z-direction can also be referred to as the depth of the receding portion 80 in the z-direction.

In the first example of the conductive member 90, the main part side faces 97, which are in two side faces opposed to each other in the x-direction on a surface electrode side and are in the y-direction perpendicular to the x-direction and the z-direction, recede toward the respective opposite sides in the x-direction, that is, the facet sides (front facet 101 side and rear facet 102 side) of the semiconductor structure part 2, the z-direction being perpendicular to the semiconductor substrate 1. Further, the first example of the conductive member 90 includes the main part 91 and the extended part 92 extending in the x-direction on the surface electrode side in the two side faces that are opposed to each other in the x-direction in the main part 91. In the first example of the conductive member 90, the receding portions 80 are formed such that they recede from the front facet 101 and from the rear facet 102 toward the respective opposite facet sides in the x-direction, the front facet 101 being the emission facet, the rear facet 102 being the other facet, and the receding portions 80 each include the extended part surface 96, which is the surface of the extended part 92 opposite to the semiconductor substrate 1, and the side face of the main part 91 (main part side face 97), which is connected to the extended part surface 96. The receding portions 80 formed in the first example of the conductive member 90 pass through two side faces opposed to each other in the conductive member 90 in the y-direction.

The conductive member 90 is, for example, a plating layer, and the conductive layers 31 and 32 are plating layers. The first example of the conductive member 90 can be formed by, for example, a two-step plating method. The semiconductor structure part 2 is formed in the semiconductor substrate 1, and the first electrode 20 on the surface of the semiconductor structure part 2 opposite to the semiconductor substrate 1 and the second electrode 22 on the rear surface of the semiconductor substrate 1 opposite to the semiconductor structure part 2 are formed by a metal sputtering process. The conductive layer 31 is formed on the surface of the first electrode 20 by a first plating process. Thereafter, a resist pattern is formed in which a portion where the receding portion 80 is to be formed is covered with a resist. The conductive layer 32 is formed on the surface of the conductive layer 31 exposed from the opening of the resist pattern by a second plating process. The method of performing the plating process a plurality of times enables easy manufacturing as compared with the case where the receding portion 80 is formed by etching, so that the mass productivity can be improved. When the first plating process is carried out, it is preferable to cover portions to be cleaved with a resist so that the plating should not be formed on the cleavage portions, and thus the formation of the front facet 110 and the rear facet 110 by the cleavage can be facilitated.

The receding portion 80 of the conductive member 90 can also be formed by etching. The conductive layer 31 having a thickness of the main part height d1 is formed on the surface of the first electrode 20 by a plating process. The conductive member 90 can be formed in such a way that a resist pattern is formed in which the portions to be formed as the receding portions 80 are opened, and by etching the conductive layer 31 until the height from the surface of the main part 91 down to the extended part surface 96 of the extended part 92 reaches Δd. The receding portions 80 formed by etching may be referred to as recesses or etched recesses formed in the conductive layer 31.

In the first example of the semiconductor laser 100 of Embodiment 1, the receding portions 80 are formed in which at least part on the side faces in the conductive member 90 on the front facet 101 side and the rear facet 102 side recedes from the front facet 101 and the rear facet 102 toward the respective other facet sides in the x-direction, so that the receding portions 80 can absorb the bonding member 40 sticking out from the main part 91 at the time of junction down mounting, and it is possible to prevent the bonding member 40 from coming around the front facet 101 and the rear facet 102. FIG. 1 shows an example in which the bonding member 40a that sticks out from the main part 91 and is from the bonding member 40 is bonded to the main part side face 97. In addition, FIG. 6 shows an example in which the bonding member 40a that sticks out from the main part 91 and is from the bonding member 40 is bonded to the main part side face 97 and the extended part surface 96 of the extended part 92. Also in the case of FIG. 6, the bonding member 40 sticking out from the main part 91 can be absorbed by the receding portion 80.

In the case where the bonding member 40 sticking out from the main part 91 in the x-direction is absorbed by the receding portion 80, it is desirable that the capacity of the receding portion 80 should be large enough to absorb the bonding member 40 sticking out from the main part 91 of the conductive member 90 in the x-direction. Since the capacity of the receding portion 80 is determined by the step height Δd, the extension length Lx in the x-direction and the extension length Ly in the y-direction of the extended part 92, the step height Δd, the extension length Lx, and the extension length Ly of the conductive member 90 are designed in accordance with the amount of the bonding member 40 used in the semiconductor laser device 200. For example, by making the step height Δd or the main part height d1 be higher than the height in the z-direction of the bonding member 40a that sticks out from the main part 91 in the x-direction and is from the bonding member 40, it is possible to use the conductive member 90 in which the receding portion 80 is formed only on one facet side as in the semiconductor laser 100 and the semiconductor laser device 200 shown in FIG. 7.

In a second example of the conductive member 90 in the second example of the semiconductor laser 100 and the semiconductor laser device 200 shown in FIG. 7, the part of the one side face thereof in the x-direction parallel to the extending direction in which the active layer 10 extends, that is, the part on the front facet 101 side, is formed away from the front facet 101 toward the rear facet 102 side, the front facet 101 being the emission facet in the semiconductor structure part 2, the rear facet 102 being the other facet opposed to the front facet 101, and the receding portion 80 is formed such that at least part of the conductive member 90 recedes toward the rear facet 102 side from the front facet 101, which is the emission facet. FIG. 7 shows an example in which the bonding member 40a that sticks out from the main part 91 on the front facet 101 side and is from the bonding member 40 is bonded to the main part side face 97, and the bonding member 40a that sticks out from the main part 91 on the rear facet 102 side and is from the bonding member 40 is bonded to the side face of the conductive layer 32 of the main part 91 on a submount 50 side. In the second example of the semiconductor laser 100, the receding portion 80 is formed such that at least part of the side face of the conductive member 90 on the front facet 101 side recedes from the front facet 101 toward the other facet side in the x-direction, and the depth of the receding portion 80, that is, the step height Δd, is higher than the height in the z-direction of the bonding member 40a that sticks out from the main part 91 in the x-direction and is from the bonding member 40. Thus, the bonding member 40a sticking out from the main part 91 can be absorbed by the receding portion 80 at the time of junction down mounting. Furthermore, in the second example of the semiconductor laser 100, since the height of the bonding member 40a sticking out in the z-direction can be lower than the main part height d1, it is possible to prevent the bonding member 40 from coming around the front facet 101 and the rear facet 102. Note that, in the two side faces opposed to each other in the x-direction in the conductive member 90, the bonding member 40 may be bonded on the submount 50 side away from the boundary between the conductive member 90 and the first electrode 20, which is the surface electrode in the semiconductor laser 100. Even in this case, since the bonding member 40a that sticks out from the main part 91 in the x-direction and is from the bonding member 40 is on the submount 50 side away from the boundary between the first electrode 20, which is the surface electrode, and the conductive member 90, the bonding member 40 can be prevented from coming around the front facet 101 and the rear facet 102.

In the second example of the conductive member 90, the main part side face 97, which is on the surface electrode side in the emission facet side (front facet 101 side) and is in the y-direction perpendicular to the x-direction and the z-direction, recedes toward the other facet side (rear facet 102 side) in the x-direction, the z-direction being perpendicular to the semiconductor substrate 1. Further, the second example of the conductive member 90 includes the main part 91 and the extended part 92 extending in the x-direction on the surface electrode side in the side face of the emission facet side (front facet 101 side) of the main part 91. In the second example of the conductive member 90, the receding portion 80 is formed so as to recede from the front facet 101, which is the emission facet, toward the other facet side (rear facet 102 side) in the x-direction, and the receding portion 80 includes the extended part surface 96, which is the surface of the extended part 92 opposite to the semiconductor substrate 1, and the side face of the main part 91 (main part side face 97) connected to the extended part surface 96. The receding portion 80 formed in the second example of the conductive member 90 passes through two side faces opposed to each other in the y-direction in the conductive member 90.

The conductive member 90 is not limited to the example in which the receding portion 80 having one step is provided, but may include the receding portion 80 having two or more steps. FIG. 8 shows a third example of a semiconductor laser 100 and a semiconductor laser device 200 including the conductive member 90 in which the receding portion 80 having two steps is formed. The third example of the conductive member 90 includes, for example, conductive layers 31, 32, and 33. The conductive layer 31 is a layer on the side of the first electrode 20, the conductive layer 32 is a layer constituting the outermost surface on the positive side in the z-direction, and the conductive layer 33 is a layer disposed between the conductive layers 31 and 32.

In the third example of the conductive member 90, as in the first example of the conductive member 90, the portion between the broken line 13b and the broken line 13c is the main part 91, and the portions between the broken line 13a and the broken line 13b and between the broken line 13c and the broken line 13d are the extended parts 92 and the receding portions 80. The receding portion 80 is a portion including the side face of the conductive layer 32, that is, the main part side face 97, which is the side face of the main part 91, extended part surfaces 96a and 96b of the extended part 92 facing the submount 50, and an extended part side face 99 that is a side face of the intermediate conductive layer 33. The receding portions 80 of the third example of the conductive member 90 are formed on both facet sides of the semiconductor structure part 2 in the x-direction, that is, on the front facet 101 side and the rear facet 102 side, so as to each include the main part side face 97 of the main part 91, and the extended part surface 96b, the extended part side faces 99, and the extended part surfaces 96a that are sequentially connected from the main part side face 97.

The length of the receding portion 80 in the x-direction is the same as the extension length Lx, which is the length of the extended part 92. The length of the receding portion 80 on the front facet 101 side in the x-direction is the length from the broken line 13a to the broken line 13b, and the length of the receding portion 80 on the rear facet 102 side in the x-direction is the length from the broken line 13c to the broken line 13d. The extension length Lx on the positive side in the x-direction is the total length of the extension length Lx1, which is a length from a broken line 14a to the broken line 13b, and the extension length Lx2, which is a length from the broken line 13a to the broken line 14a. The extension length Lx on the negative side in the x-direction is the total length of the extension length Lx1, which is a length from a broken line 14b to the broken line 13c, and the extension length Lx2, which is a length from the broken line 13d to the broken line 14b. The broken lines 13a and 13d are broken lines along the extended part side surfaces 98 of the conductive layer 31 in the extended parts 92, the broken lines 14a and 14b are broken lines along the extended part side faces 99 of the conductive layer 33 in the extended parts 92, and the broken lines 13b and 13c are broken lines along the main part side faces 97 of the main part 91.

The height of the receding portion 80 in the z-direction is the step height Δd between the surface of the extended part surface 96a, which is the surface of the conductive layer 31, and the surface of the conductive layer 32, and is the total height of a step height Δd1 between the surface of the conductive layer 32 and the surface of the conductive layer 33 and a step height Δd2 between the surface of the conductive layer 33 and the surface of the conductive layer 31. The height of the main part 91 in the z-direction is the main part height d1, and the height of the extended part 92 in the z-direction is the extended part height d2. The extended part height d2 is the total height of a conductive layer height d3a, which is the height of the conductive layer 31 in the z-direction, and a conductive layer height d3b, which is the height of the conductive layer 33 in the z-direction. The height of the receding portion 80 in the z-direction is the difference between the main part height d1, which is the height of the main part 91 in the z-direction, and the conductive layer height d3a, which the height of the conductive layer 31 in the z-direction on the first electrode 20 side in the extended part 92.

In the third example of the semiconductor laser 100 of Embodiment 1, as in the first example of the semiconductor laser 100, at least part of the side faces of the front facet 101 side and the rear facet 102 side of the conductive member 90 are formed with the receding portions 80 that recede from the front facet 101 and the rear facet 102 toward the respective other facet sides in the x-direction, so that the receding portions 80 can absorb the bonding member 40 sticking out from the main part 91 at the time of junction down mounting, and can prevent the bonding member 40 from coming around the front facet 101 and the rear facet 102. FIG. 8 shows an example in which the bonding member 40a that sticks out from the main part 91 and is from the bonding member 40 is bonded to the main part side faces 97.

As described above, the semiconductor laser 100 of Embodiment 1 includes the semiconductor substrate 1, the semiconductor structure part 2 that is formed on the surface of the semiconductor substrate 1 and includes the active layer 10 for generating light emitted from the emission facet (front facet 101), the surface electrode (first electrode 20) formed on the surface of the semiconductor structure part 2 opposite to the semiconductor substrate 1, and the conductive member 90 formed on the surface of the surface electrode (first electrode 20) opposite to the semiconductor substrate 1. The conductive member 90 is such that the part thereof (main part side face 97) in the side face on the emission facet side (front facet 101 side), which is one side face in the x-direction parallel to the extending direction in which the active layer 10 extends, is formed away from the emission facet (front facet 101) in the semiconductor structure part 2 toward the other facet side (rear facet 102 side) opposite to the emission facet (front facet 101) in the x-direction. In the semiconductor laser 100, the receding portion 80 is formed in which at least the part of the conductive member 90 (main part side face 97) recedes from the emission facet (front facet 101) toward the other facet side (rear facet 102 side) in the x-direction. In the semiconductor laser 100 of Embodiment 1, with the structure described above, since the receding portion 80 is formed in which at least the part (main part side face 97) of the side face of the conductive member 90 on the emission facet side (front facet 101 side) recedes from the emission facet (front facet 101) toward the other facet side (rear facet 102 side) in the x-direction, it is possible to prevent the bonding member 40 from coming around the light emission facet (front facet 101) at the time of junction down mounting.

The semiconductor laser device 200 according to Embodiment 1 includes the semiconductor laser 100 and the submount 50 on which the semiconductor laser 100 is mounted, and the conductive member 90 of the semiconductor laser 100 is bonded to the submount 50 with the bonding member 40. The semiconductor laser 100 is provided with the semiconductor substrate 1, the semiconductor structure part 2 that is formed on the surface of the semiconductor substrate 1 and includes the active layer 10 for generating light emitted from the emission facet (front facet 101), the surface electrode (first electrode 20) formed on the surface of the semiconductor structure part 2 opposite to the semiconductor substrate 1, and the conductive member 90 formed on the surface of the surface electrode (first electrode 20) opposite to the semiconductor substrate 1. The conductive member 90 is such that the part (main part side face 97) of the emission facet side (front facet 101 side), which is one side face in the x-direction parallel to the extending direction in which the active layer 10 extends, is formed away from the emission facet (front facet 101) in the semiconductor structure part 2 toward the other facet side (rear facet 102 side) opposite to the emission facet (front facet 101) in the x-direction. In the semiconductor laser 100, the receding portion 80 is formed in which at least the part (main part side face 97) of the conductive member 90 recedes from the emission facet (front facet 101) to the other facet side (rear facet 102 side) in the x-direction. In the two side faces opposed to each other in the x-direction in the conductive member 90, the bonding member 40 is bonded on the submount 50 side away from the boundary between the surface electrode (first electrode 20) and the conductive member 90 in the semiconductor laser 100. In the semiconductor laser device 200 of Embodiment 1, with the structure described above, since the receding portion 80 is formed such that at least the part (main part side face 97) of the side face of the conductive member 90 on the emission facet side (front facet 101 side) recedes from the emission facet (front facet 101) toward the other facet side (rear facet 102 side) in the x-direction, it is possible to prevent the bonding member 40 from coming around the light emission facet (front facet 101) at the time of junction down mounting.

Embodiment 2

Figure 18:
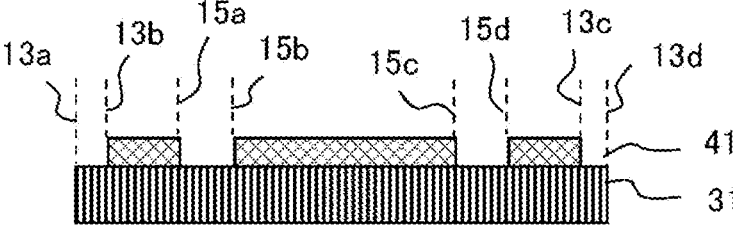
FIG. 18 is a diagram for explaining another method of forming the first example of the conductive member according to Embodiment 2.
Figure 19:
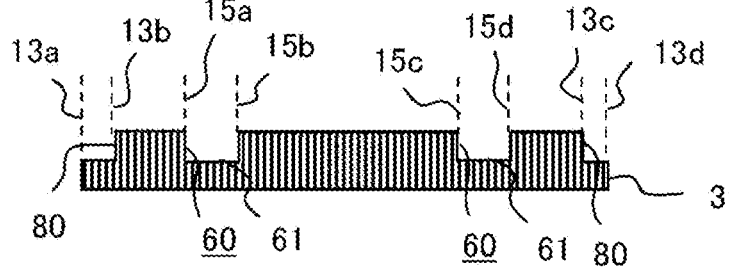
FIG. 19 is a diagram for explaining another method of forming the first example of the conductive member according to Embodiment 2.
Figure 20:
FIG. 20 is a diagram for explaining a method of forming the second example and the third example of the conductive member according to Embodiment 2.
Figure 21:
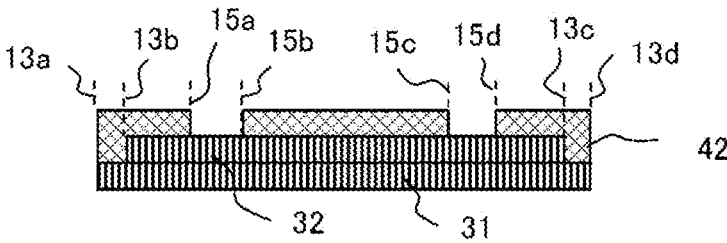
FIG. 21 is a diagram for explaining the method of forming the second example and the third example of the conductive member according to Embodiment 2.
Figure 22:
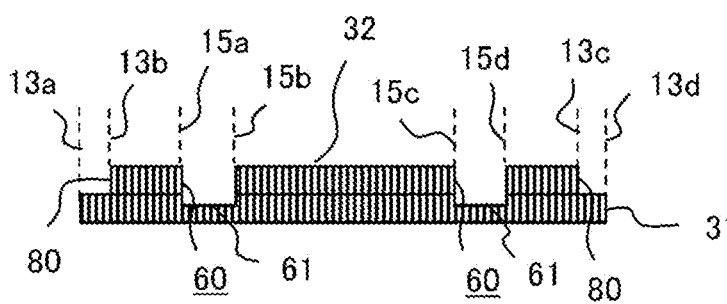
FIG. 22 is a diagram for explaining the method of forming the second example of the conductive member according to Embodiment 2.
Figure 26:
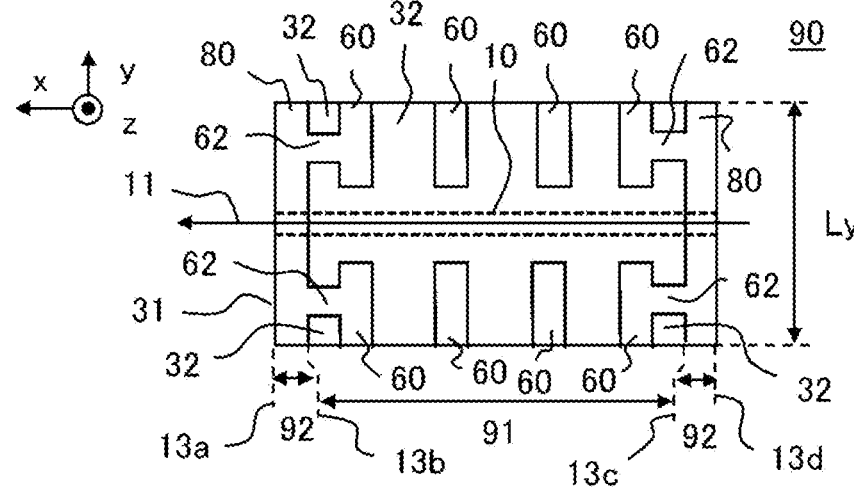
FIG. 26 is a plan view showing a sixth example of the conductive member according to Embodiment 2.

FIG. 10 is a cross-sectional view showing a semiconductor laser and a semiconductor laser device according to Embodiment 2, and FIG. 11 is a perspective view of the semiconductor laser according to Embodiment 2. FIG. 12 is a plan view of a conductive member of FIG. 11, and FIG. 13 is a cross-sectional view showing a principal part of the first example of the conductive member of FIG. 11. FIG. 14 is a cross-sectional view showing a principal part of a second example of the conductive member of FIG. 11, and FIG. 15 is a cross-sectional view showing a principal part of a third example of the conductive member of FIG. 11. FIG. 16 and FIG. 17 are diagrams for explaining a method of forming the first example of the conductive member according to Embodiment 2. FIG. 18 and FIG. 19 are diagrams for explaining another method of forming the first example of the conductive member according to Embodiment 2. FIG. 20 and FIG. 21 are diagrams for explaining a method of forming the second example and the third example of the conductive member according to Embodiment 2. FIG. 22 is a diagram for explaining a method of forming the second example of the conductive member according to Embodiment 2, and FIG. 23 is a diagram for explaining a method of forming the third example of the conductive member according to Embodiment 2. FIG. 24 is a plan view showing a fourth example of the conductive member according to Embodiment 2, and FIG. 25 is a plan view showing a fifth example of the conductive member according to Embodiment 2. FIG. 26 is a plan view showing a sixth example of the conductive member according to Embodiment 2. The semiconductor laser 100 and the semiconductor laser device 200 of Embodiment 2 are different from the semiconductor laser 100 and the semiconductor laser device 200 of Embodiment 1 in that the conductive member 90 includes a groove 60. In FIG. 11, a texture pattern for the conductive layer 32 is omitted so that the groove 60 can be clearly seen. Differences from the semiconductor laser 100 and the semiconductor laser device 200 of Embodiment 1 will be mainly described.

The conductive member 90 is provided with the grooves 60 passing through two side faces opposed to each other in the y-direction or the grooves 60 connected to the side faces in the y-direction, on the surface of the main part 91 opposite to the semiconductor substrate 1. In the first example of the conductive member 90, there are two grooves 60 extending in the y-direction, and a groove depth Δg, which is the depth of the groove 60 in the z-direction, is the same as the step height Δd of the receding portion 80. In the second example of the conductive member 90, there are two grooves 60 extending in the y-direction, and the groove depth Δg of the groove 60 is larger than the step height Δd of the receding portion 80. In the third example of the conductive member 90, there are two grooves 60 extending in the y-direction, and the groove depth Δg of the groove 60 is smaller than the step height Δd of the receding portion 80. In the second and third examples of the conductive member 90, the groove depth Δg of the groove 60 is different from the step height Δd of the receding portion 80. The grooves 60 are formed between broken lines 15a and 15b and between broken lines 15c and 15d. A groove width Lg, which is the width in the two grooves 60 in the x-direction, is the same, for example. FIG. 26 shows a sixth example of the conductive member 90 having the grooves 60 connected to the side faces in the y-direction.

Since the conductive member 90 is provided with the receding portions 80 on the front facet 101 side and the rear facet 102 side, and is further provided with the grooves 60 in the main part 91, the bonding member 40 around the grooves 60 can be absorbed by the grooves 60 and the bonding member 40 sticking out from the main part 91 can be absorbed by the receding portions 80 at the time of junction down mounting. Therefore, in the semiconductor laser 100 and the semiconductor laser device 200 of Embodiment 2, similarly to the semiconductor laser 100 and the semiconductor laser device 200 of Embodiment 1, the bonding member 40 can be prevented from coming around the front facet 101 and the rear facet 102 at the time of junction down mounting. FIG. 10 shows an example in which the bonding member 40a that sticks out from the main part 91 and is from the bonding member 40 is bonded to the main part side faces 97, and the bonding member 40b as part of the bonding member 40 is bonded to the side faces of the grooves 60 in the x-direction.

In the semiconductor laser 100 and the semiconductor laser device 200 of Embodiment 2, since the grooves 60 can absorb the bonding member 40, the the bonding member 40 that sticks out toward the receding portions 80 can be reduced as compared with the semiconductor laser 100 and the semiconductor laser device 200 of Embodiment 1, and the effect of preventing the bonding member 40 from coming around the front facet 101 and the rear facet 102 can be enhanced as compared with the semiconductor laser 100 and the semiconductor laser device 200 of Embodiment 1. In the semiconductor laser 100 and the semiconductor laser device 200 of Embodiment 2, since the conductive member 90 is provided with the grooves 60, the surface area of the conductive member 90 on the side of the submount 50 can be made larger than that of the conductive member 90 of Embodiment 1, that is, the surface area can be made larger by an amount of a surface area of the side faces of the grooves 60 in the x-direction than that of the conductive member 90 of Embodiment 1, so that the heat dissipation to the submount 50 can be improved more than that of the semiconductor laser 100 and the semiconductor laser device 200 of Embodiment 1.

The conductive member 90 is, for example, a plating layer, and the conductive layers 31 and 32 are plating layers. The first example of the conductive member 90 can be formed by, for example, a two-step plating method. The first electrode 20 on the surface of the semiconductor structure part 2 opposite to the semiconductor substrate 1 and the second electrode 22 on the rear surface of the semiconductor substrate 1 opposite to the semiconductor structure part 2 are formed by a metal sputtering process. The conductive layer 31 is formed on the surface of the first electrode 20 by a first plating process. Thereafter, as shown in FIG. 16, a resist pattern 41 is formed in which portions to be formed as the receding portions 80 and the grooves 60 are covered with a resist. Portions shown between the broken line 13*a* and the broken line 13*b* and between the broken line 13*c* and the broken line 13*d* are portions where the receding portions 80 are to be formed, and portions shown between the broken line 15*a* and the broken line 15*b* and between the broken line 15*c* and the broken line 15*d* are portions where the grooves 60 are to be formed. The conductive layer 32 is formed by a second plating process on the surface of the conductive layer 31 exposed from the openings of the resist pattern 41. By removing the resist pattern 41, the conductive member 90 having the receding portions 80 and the grooves 60 are formed as shown in FIG. 17.

The groove depth Δg of the groove 60 in the conductive member 90 and the step height Δd of the receding portion 80 can be adjusted depending on the amount of the bonding member 40 to be used. In a case where the amount of the bonding member 40 to be used is large, the groove depth Δg of the groove 60 and the step height Δd of the receding portion 80 are larger than those in a case where the amount of the bonding member 40 to be used is small, so that the effect of preventing the bonding member 40 from coming around the front facet 101 and the rear facet 102 can be enhanced. The groove depth Δg of the groove 60 and the step height Δd of the receding portion 80 can be set in accordance with the thickness of the resist pattern 41 in the z-direction. For example, if the thickness of the resist pattern 41 in the z-direction is increased, the groove depth Δg of the groove 60 and the step height Δd of the receding portion 80 are increased, and if the thickness of the resist pattern 41 in the z-direction is decreased, the groove depth Δg of the groove 60 and the step height Δd of the receding portion 80 are decreased. The method of performing the plating process a plurality of times enables easy manufacturing as compared with the case where the receding portion 80 and the groove 60 are formed by etching, so that the mass productivity can be improved. Note that, when the first plating process is performed, in order to facilitate formation of the front facet 101 and the rear facet 102 by cleavage, it is preferable to cover the portions to be cleaved with a resist so that the plating should not be formed thereon.

The receding portion 80 of the conductive member 90 can also be formed by etching. FIG. 18 and FIG. 19 show a method of forming the first example of the conductive member 90 by using an etching process. The conductive layer 31 having a thickness of the main part height d1 is formed on the surface of the first electrode 20 by a plating process. Since the height of the conductive layer 31 in the z-direction is the same as the main part height d1 of the main part 91, the conductive layer 31 is formed thicker than that in the two-step plating method shown in FIG. 16 and FIG. 17. The conductive layer 31 having the thickness of the main part height d1 is formed on the surface of the first electrode 20 by a plating process. As shown in FIG. 18, the resist pattern 41 is formed in which the portions thereof where the receding portions 80 and the grooves 60 are formed are opened. The openings shown between the broken line 13*a* and the broken line 13*b* and between the broken line 13*c* and the broken line 13*d* are portions where the receding portions 80 are formed, and the openings shown between the broken line 15*a* and the broken line 15*b* and between the broken line 15*c* and the broken line 15*d* are portions where the grooves 60 are formed. Thereafter, the conductive layer 31 is etched until the height from the surface of the main part 91 to the extended part surface 96 of the extended part 92 becomes Δd and the depth from the surface of the main part 91 to a bottom surface 61 of the groove 60 becomes Δg, which is the same as Δd. By removing the resist pattern 41 after the etching process, the conductive member 90 having the receding portions 80 and the grooves 60 is formed as shown in FIG. 19. The receding portions 80 and the grooves 60 formed by the etching process may be referred to as recesses or etched recesses formed in the conductive layer 31.

Further, by combining the two-step plating method and the etching process, it is possible to form the conductive member 90 having the groove depth Δg different in size from the step height Δd of the receding portion 80. As shown in FIG. 20, on the surface of the conductive layer 31 formed on the surface of the first electrode 20 by the first plating process, the resist pattern 41 is formed in which portions to be formed as the receding portions 80 are covered with a resist. The conductive layer 32 is formed on the surface of the conductive layer 31 exposed from the opening of the resist pattern by the second plating process, and the resist pattern 41 is removed, thereby forming the conductive member 90 having only the receding portions 80. This is the same as the case where the conductive member 90 of Embodiment 1 is formed by the two-step plating method. Thereafter, as shown in FIG. 21, a resist pattern 42 having openings at the portions where the grooves 60 are to be formed is formed. The openings shown between the broken lines 15*a* and 15*b* and between the broken lines 15*c* and 15*d* are portions where the grooves 60 are formed. Thereafter, the conductive layer 32 is etched until the depth from the surface of the main part 91 to the bottom surface 61 of the groove 60 becomes Δg, or the conductive layer 32 and the conductive layer 31 are etched. By removing the resist pattern 41 after the etching process, the conductive member 90 having the receding portions 80 and the grooves 60 is formed as shown in FIG. 22 or FIG. 23.

The conductive member 90 shown in FIG. 22 is the second example of the conductive member obtained by etching the conductive layer 32 and the conductive layer 31. The grooves 60 formed by the etching process in the second example of the conductive member 90 can also be referred to as recesses or etched recesses formed in the conductive layer 31 and the conductive layer 32. The conductive member 90 shown in FIG. 23 is the third example of the conductive member obtained by etching the conductive layer 32. The grooves 60 formed by the etching process in the third example of the conductive member 90 can also be referred to as recesses or etched recesses formed in the conductive layer 32. By combining the two-step plating method and the etching process, the step height Δd of the receding portion 80 and the groove depth Δg of the groove 60 can be independently adjusted in accordance with the amount of the bonding member 40 to be used.

Although FIG. 10 to FIG. 23 show the examples for the receding portion 80 with one stage, the semiconductor laser 100 and the semiconductor laser device 200 according to Embodiment 2 may include the receding portion 80 with two or more stages shown in FIG. 8, or the receding portion 80 may be formed only on one facet side as shown in FIG. 7. That is, the conductive member 90 having the grooves 60 may be applied to the third example of the semiconductor laser 100 and the semiconductor laser device 200 according to Embodiment 1 shown in FIG. 8, and the conductive member 90 having the grooves 60 may be applied to the second example of the semiconductor laser 100 and the semiconductor laser device 200 according to Embodiment 1 shown in FIG. 7. In these semiconductor lasers 100 and semiconductor laser devices 200, the absorption function on the bonding member 40 by the grooves 60 can improve the effect of preventing the bonding member 40 from coming around the front facet 101 and the rear facet 102 of the third example of the semiconductor laser 100 and semiconductor laser device 200 according to Embodiment 1 or the second example of the semiconductor laser 100 and semiconductor laser device 200 according to Embodiment 1, and the heat dissipation can be improved as the surface area of the conductive member 90 on the submount 50 side is increased by the grooves 60.

The number of grooves 60 in the conductive member 90 is not limited to two. The number of grooves 60 in the conductive member 90 may be three or more. As the number of the grooves 60 is increased, the effect of preventing the bonding member 40 from coming around the front facet 101 and the rear facet 102 and the effect of improving heat dissipation can be enhanced. FIG. 24 shows the fourth example of the conductive member 90 having three grooves 60. Further, the groove 60 is not limited to that extending in the y-direction perpendicular to the x-direction, but may extend in a direction inclined with respect to the y-direction as shown in FIG. 25. FIG. 25 shows an example in which two grooves 60 pass through two side faces opposed to each other in the main part 91 in the y-direction at an angle to the y-direction. The groove 60 of the conductive member 90 is not limited to an example in which it passes through two opposed side faces to each other in the main part 91 in the y-direction, and may be the groove connected to the side faces in the y-direction without passing through them as shown in FIG. 26. FIG. 26 shows the sixth example of the conductive member 90 having four grooves 60 extending to the periphery of the active layer 10 on the positive side in the y-direction and four grooves 60 extending to the periphery of the active layer 10 on the negative side in the y-direction on the side faces of the main part 91 in the y-direction. Further, the sixth example of the conductive member 90 shows an example in which the grooves 60 adjacent to the receding portions 80 are connected to the receding portions 80 by connection grooves 62. The four grooves 60 extending to the periphery of the active layer 10 in the positive y-direction are formed on the side face of the main part 91 on the upper side of FIG. 26, and the four grooves 60 extending to the periphery of the active layer 10 in the negative y-direction are formed on the side face of the main part 91 on the lower side of FIG. 26. Note that, the groove 60 connected to one side face in the y-direction may extend beyond the active layer 10 from the one side face in the y-direction to the other side face in the y-direction. Even if in the groove 60 as in the sixth example of the conductive member 90, which is not passing through the opposed side faces to each other in the main part 91 in the y-direction, the semiconductor laser 100 and the semiconductor laser device 200 according to Embodiment 2 provided with the grooves 60 and the receding portions 80 can improve the effect of preventing the bonding member 40 from coming around the front facet 101 and the rear facet 102, and can improve heat dissipation as the surface area of the conductive members 90 on the submount 50 side by the grooves 60 is increased.

Embodiment 3

Figure 27:
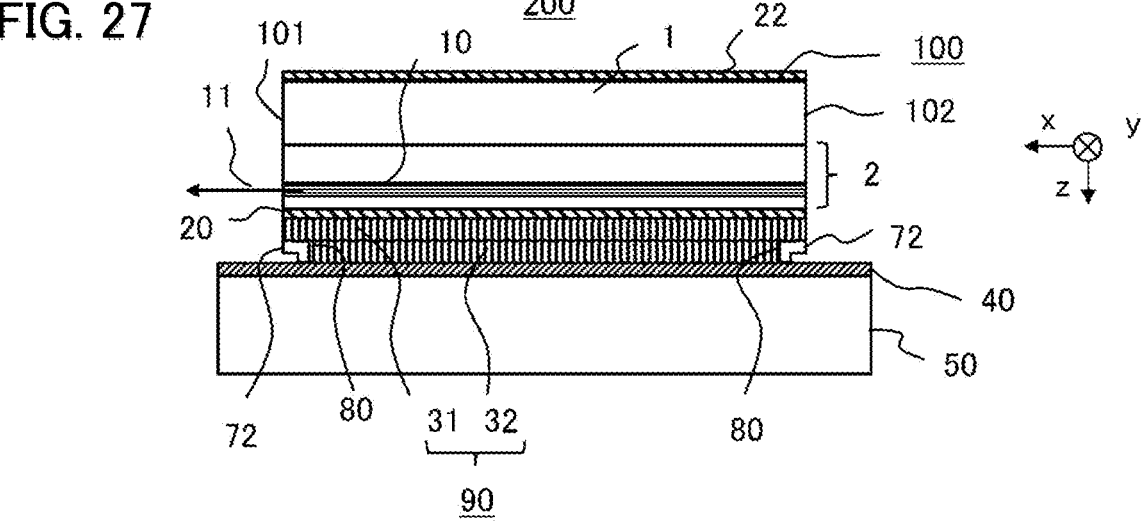
FIG. 27 is a cross-sectional view showing a semiconductor laser and a semiconductor laser device according to Embodiment 3.
Figure 28:
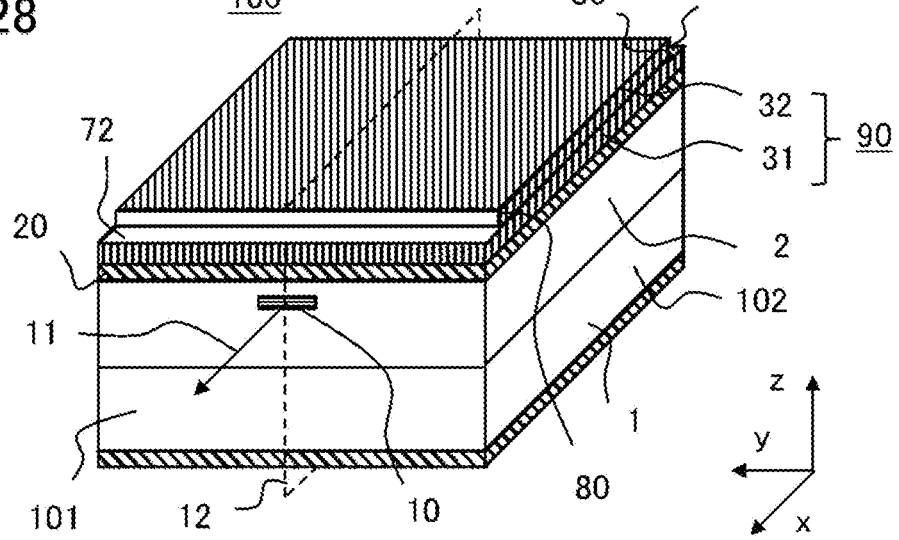
FIG. 28 is a perspective view of the semiconductor laser according to Embodiment 3.
Figure 29:
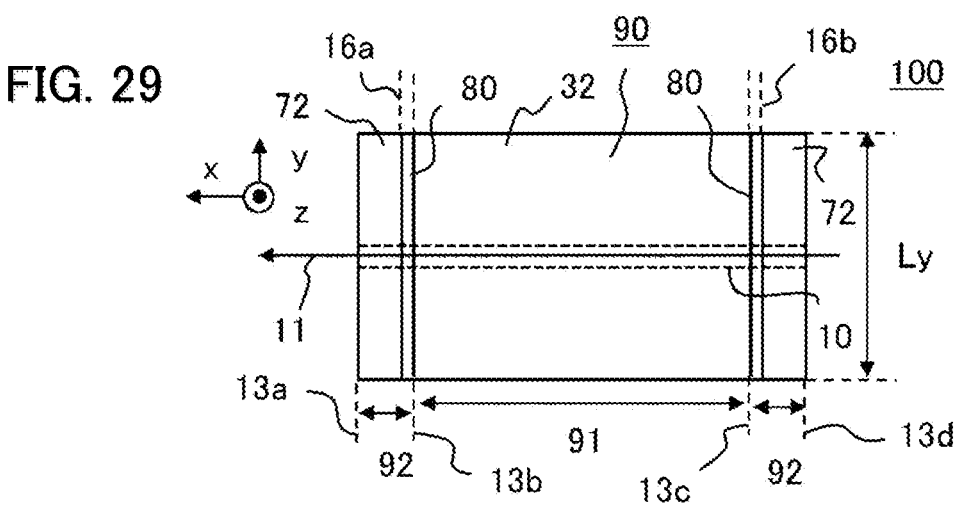
FIG. 29 is a plan view of the semiconductor laser of FIG. 28.
Figure 30:
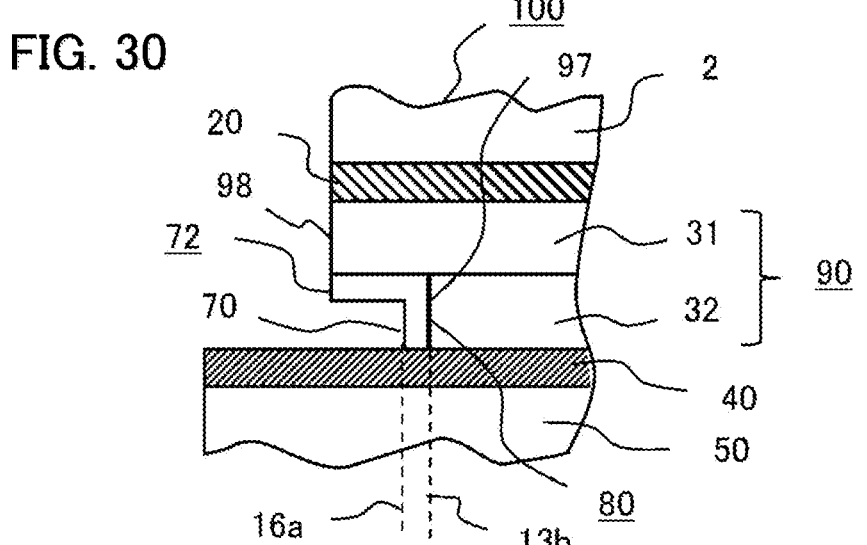
FIG. 30 is a cross-sectional view showing a principal part of a first example of the conductive member of FIG. 28.
Figure 31:
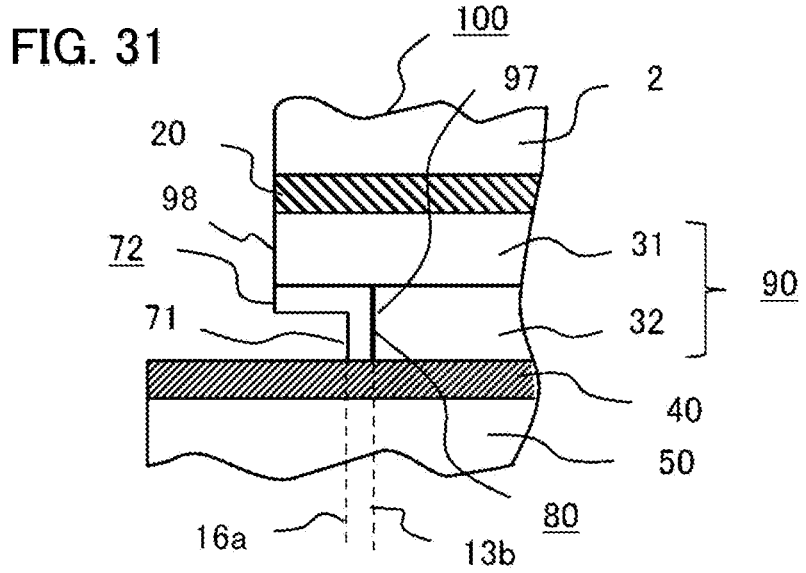
FIG. 31 is a cross-sectional view showing a principal part of a second example of the conductive member of FIG. 28.

FIG. 27 is a cross-sectional view showing a semiconductor laser and a semiconductor laser device according to Embodiment 3, and FIG. 28 is a perspective view of the semiconductor laser according to Embodiment 3. FIG. 29 is a plan view of the semiconductor laser of FIG. 28. FIG. 30 is a cross-sectional view showing a principal part of a first example of the conductive member of FIG. 28, and FIG. 31 is a cross-sectional view showing a principal part of a second example of the conductive member of FIG. 28. The semiconductor laser 100 and the semiconductor laser device 200 of Embodiment 3 are different from the semiconductor laser 100 and the semiconductor laser device 200 of Embodiment 1 in that an adhesion preventing member 72 for preventing adhesion of the bonding member 40 is formed in the receding portions 80 of the conductive member 90. Differences from the semiconductor laser 100 and the semiconductor laser device 200 of Embodiment 1 will be mainly described. The adhesion preventing member 72 is, for example, a resist 70 or an insulating film 71 such as a silicon oxide film like SiOx, and a silicon nitride film like SiNx. FIG. 30 shows an example in which the adhesion preventing member 72 is the resist 70, and FIG. 31 shows an example in which the adhesion preventing member 72 is the insulating film 71. The adhesion preventing member 72 covers the extended part surface 96 and the main part side face 97 of the receding portion 80 from the broken line 13a to the broken line 13b, and covers the extended part surface 96 and the main part side face 97 of the receding portion 80 from the broken line 13c to the broken line 13d. In the adhesion preventing member 72, a portion from a broken line 16a to the broken line 13b and a portion from a broken line 16b to the broken line 13c are portions covering the main part side faces 97 in the receding portions 80.

In the semiconductor laser 100 and the semiconductor laser device 200 according to Embodiment 3, the adhesion preventing member 72 that prevents adhesion of the bonding member 40 is formed in the receding portions 80 of the conductive member 90, so that the bonding member 40 that sticks out from the main part 91 at the time of junction down mounting can be prevented from creeping up from the receding portions 80 to the extended part side faces 98 of the extended parts 92. Therefore, in the semiconductor laser 100 and the semiconductor laser device 200 of Embodiment 3, it is possible to prevent the bonding member 40 from coming around the front facet 101 and the rear facet 102. In the semiconductor laser device 200 according to Embodiment 3, the bonding member is not connected to the side faces in the x-direction in the receding portions 80 of the conductive member 90, that is, the main part side faces 97, the side faces being those in which the adhesion preventing member 72 is formed thereon. The amount of the bonding member 40 such as a solder material, which sticks out from the main part 91 at the time of junction down mounting, to be bonded to the side faces of the conductive member 90 in the y-direction is larger than that in a case where the adhesion preventing member 72 is not formed in the receding portions 80.

In the semiconductor laser 100 of Embodiment 3, after the conductive member 90 of the semiconductor laser 100 of Embodiment 1 is formed, the adhesion preventing member 72 is formed on the receding portions 80. In a case where the adhesion preventing member 72 is the resist 70, the semiconductor laser 100 in which no adhesion preventing member is formed is coated with the resist 70 by a spin coater. Thereafter, the resist 70 is patterned by exposure and development, and a curing process such as UV curing is performed, whereby the semiconductor laser 100 of Embodiment 3 provided with the adhesion preventing member 72 of the resist 70 in the receding portions 80 can be manufactured. The resist 70 may be a positive type or a negative type. In a case where the adhesion preventing member 72 is the insulating film 71, the insulating film 71 is formed on the semiconductor laser 100 in which no adhesion preventing member 72 is formed, by an insulating film forming apparatus. Thereafter, a resist pattern having an opening except for a portion where the insulating film 71 is to remain is formed, and the exposed insulating film 71 is etched, whereby the semiconductor laser 100 of Embodiment 3 having the adhesion preventing member 72 of the insulating film 71 in the receding portions 80 can be manufactured.

Embodiment 4

Figure 32:
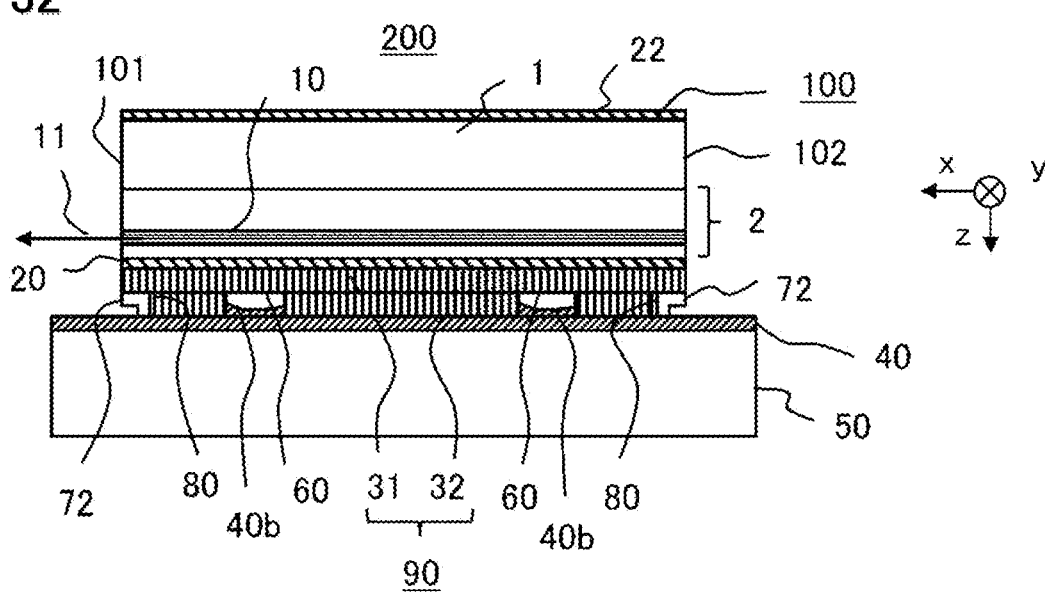
FIG. 32 is a cross-sectional view showing a semiconductor laser and a semiconductor laser device according to Embodiment 4.
Figure 33:
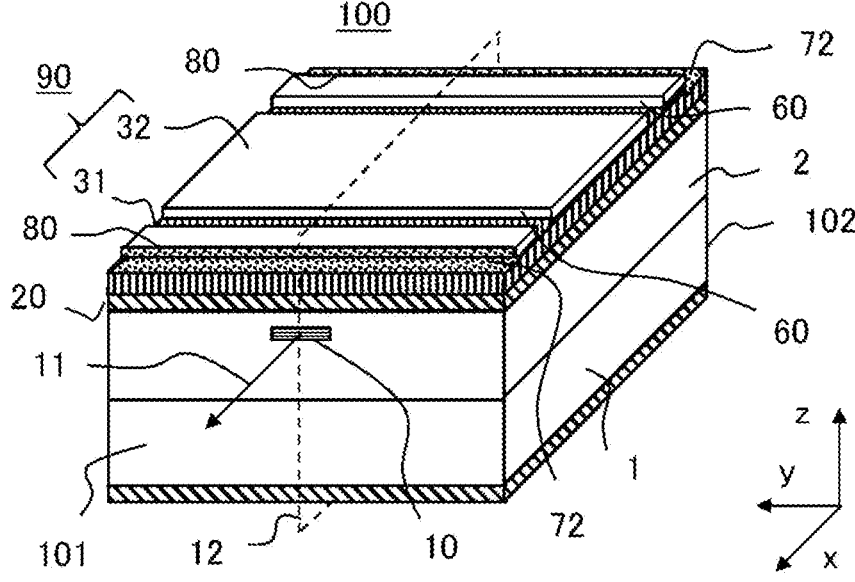
FIG. 33 is a perspective view of the semiconductor laser according to Embodiment 4.
Figure 34:
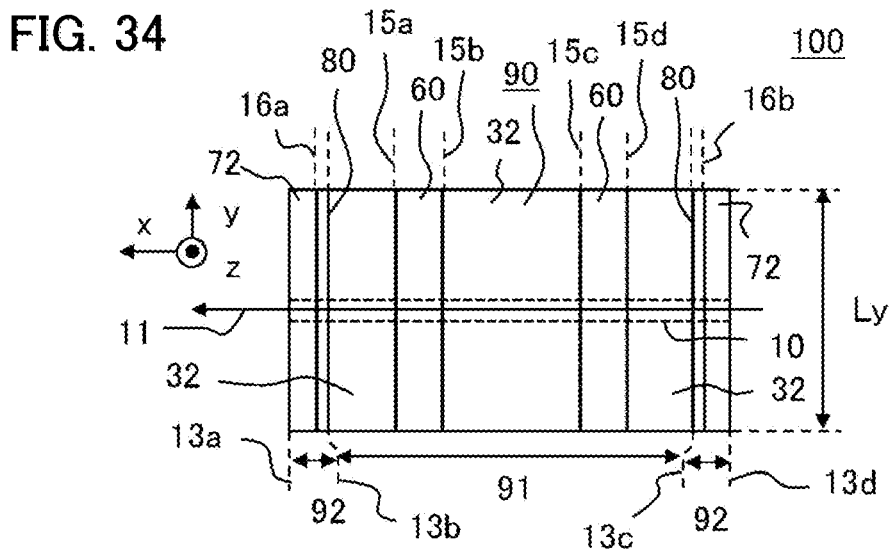
FIG. 34 is a plan view of the semiconductor laser of FIG. 33.

FIG. 32 is a cross-sectional view showing a semiconductor laser and a semiconductor laser device according to Embodiment 4, and FIG. 33 is a perspective view of the semiconductor laser according to Embodiment 4. FIG. 34 is a plan view of the semiconductor laser of FIG. 33. The semiconductor laser 100 and the semiconductor laser device 200 of Embodiment 4 are different from the semiconductor laser 100 and the semiconductor laser device 200 of Embodiment 3 in that the conductive member 90 includes grooves 60. Differences from the semiconductor laser 100 and the semiconductor laser device 200 of Embodiment 3 will be mainly described. In FIG. 32, a texture pattern for the conductive layer 32 is omitted so that the groove 60 can be clearly seen, and a texture pattern is put on the adhesion preventing member 72 so that the adhesion preventing member 72 can be clearly seen.

The conductive member 90 is provided with grooves 60 passing through two side faces opposed to each other in the y-direction or the grooves 60 connected to the side faces in the y-direction on the surface of the main part 91 opposite to the semiconductor substrate 1. As the grooves 60 in the conductive member 90 of Embodiment 4, the grooves 60 in the first to sixth examples of the conductive member 90 described in Embodiment 2 can be used. In FIG. 32 to FIG. 34, an example is shown in which the grooves 60 in the first example of the conductive member 90 described in Embodiment 2 are provided. The method of forming the conductive member 90 having the grooves 60 and the receding portions 80 is as described in Embodiment 2. After the conductive member 90 having the grooves 60 and the receding portions 80 is formed, the adhesion preventing member 72 described in Embodiment 3 is formed in the receding portions 80. FIG. 34 is a diagram in which two grooves 60 are added in FIG. 29. The portions where the grooves 60 are formed are portions between the broken lines 15a and 15b and between the broken lines 15c and 15d.

The conductive member 90 is provided with the receding portions 80 in which the adhesion preventing member 72 is formed on the front facet 101 side and the rear facet 102 side, and is further provided with the grooves 60 in the main part 91, so that at the time of junction down mounting, the bonding member 40 around the grooves 60 can be absorbed by the grooves 60, and the bonding member 40 sticking out from the main part 91 can be prevented from creeping up from the receding portions 80 to the extended part side faces 98 of the extended parts 92 by the adhesion preventing member 72. Therefore, the semiconductor laser 100 and the semiconductor laser device 200 of Embodiment 4 can prevent the bonding member 40 from coming around the front facet 101 and the rear facet 102 at the time of junction down mounting, similarly to the semiconductor laser 100 and the semiconductor laser device 200 of Embodiment 3. FIG. 32 shows an example in which the bonding member 40b, which is part of the bonding member 40, is bonded to the side faces of the grooves 60 in the x-direction.

In the semiconductor laser 100 and the semiconductor laser device 200 of Embodiment 4, since the grooves 60 can absorb the bonding member 40, the bonding member 40 sticking out toward the receding portions 80 can be reduced as compared with the semiconductor laser 100 and the semiconductor laser device 200 of Embodiment 3, and the effect of preventing the bonding member 40 from coming around the front facet 101 and the rear facet 102 can be enhanced as compared with the semiconductor laser 100 and the semiconductor laser device 200 of Embodiment 3. In the semiconductor laser 100 and the semiconductor laser device 200 of Embodiment 4, since the conductive member 90 is provided with the grooves 60, the surface area of the conductive member 90 on the side of the submount 50 can be made larger than that of the conductive member 90 of Embodiment 3. That is, the surface area can be made larger by an amount of a surface area of the side faces of the grooves 60 in the x-direction than that of the conductive member 90 of Embodiment 3, so that the heat dissipation to the submount 50 can be improved more than that of the semiconductor laser 100 and the semiconductor laser device 200 of Embodiment 3.

As a structure for the receding portion 80 of the conductive member 90, the structure of the receding portion 80 in the second example of the semiconductor laser 100 described in Embodiment 1 (refer to FIG. 7) and the structure of the receding portions 80 in the third example of the semiconductor laser 100 (refer to FIG. 8) may be used. As described in Embodiment 3, the adhesion preventing member 72 is, for example, the resist 70, the insulating film 71 such as a silicon oxide film and a silicon nitride film.

Embodiment 5

Figure 35:
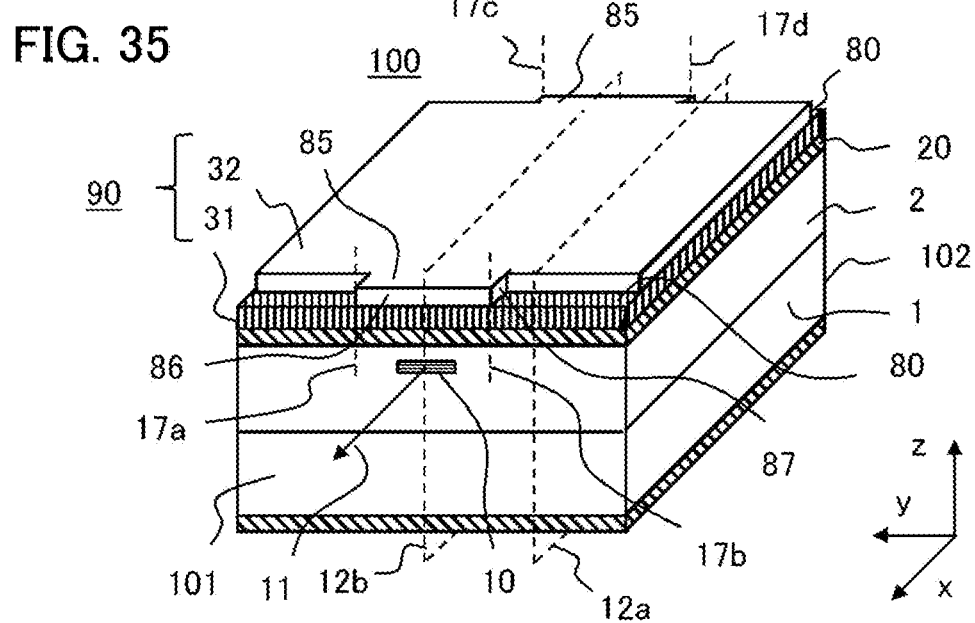
FIG. 35 is a perspective view of a semiconductor laser according to Embodiment 5.
Figures 36, 37, 38:
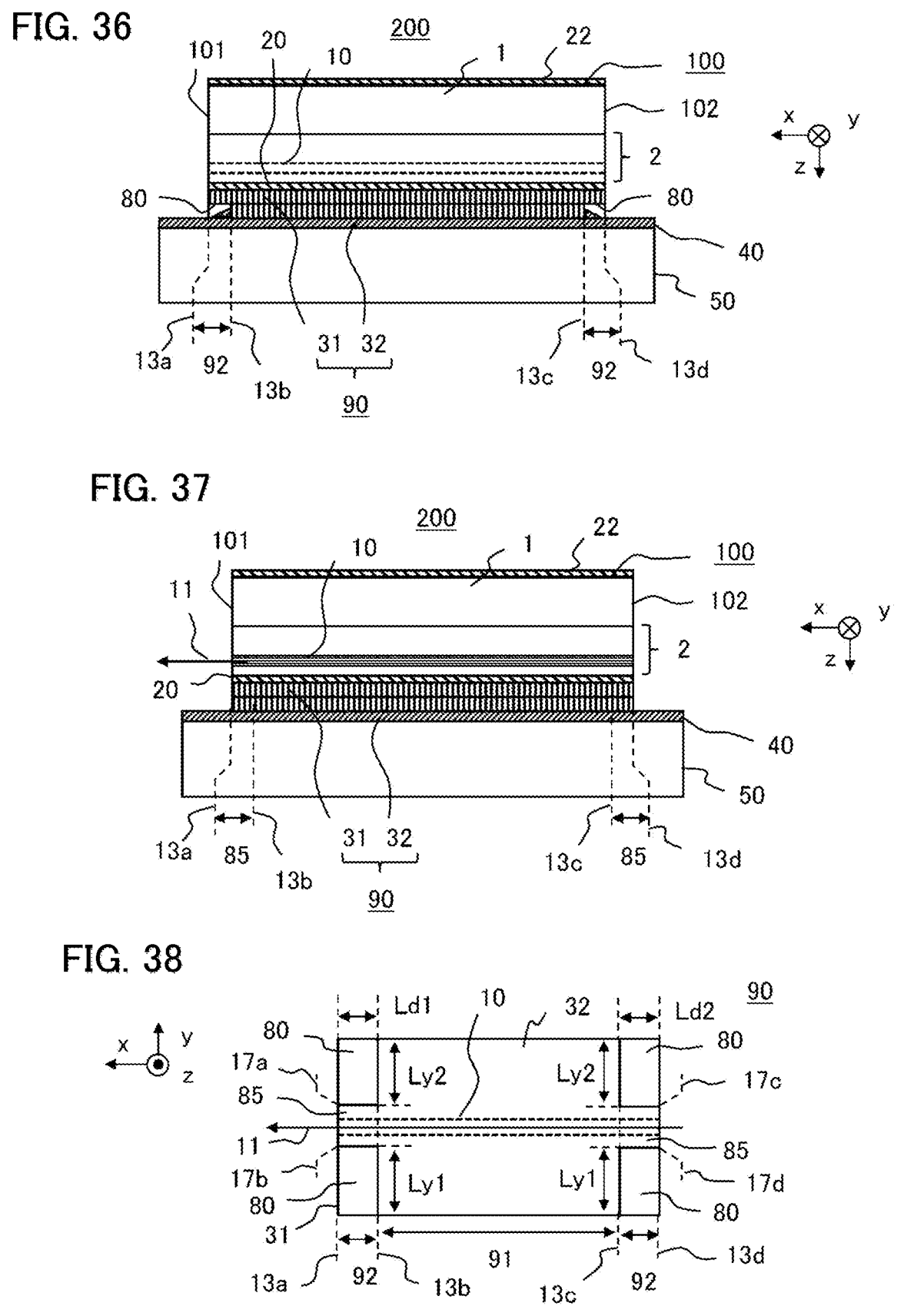

FIG. 35 is a perspective view of a semiconductor laser according to Embodiment 5. FIG. 36 is a cross-sectional view including a cross section of the receding portions in the semiconductor laser and a semiconductor laser device of Embodiment 5, and FIG. 37 is a cross-sectional view including a cross section of a tip main part in the semiconductor laser and the semiconductor laser device according to Embodiment 5. FIG. 38 is a plan view showing a first example of the conductive member of FIG. 35, and FIG. 39 is a plan view showing a second example of the conductive member of FIG. 35. FIG. 40 is a plan view showing a third example of the conductive member of FIG. 35, and FIG. 41 is a plan view showing a fourth example of the conductive member of FIG. 35. The semiconductor laser 100 and the semiconductor laser device 200 of Embodiment 5 are different from the semiconductor laser 100 and the semiconductor laser device 200 of Embodiment 1 in that the receding portions 80 are formed on at least one of the front facet 101 side and the rear facet 102 side except for the portion of the conductive member 90 encompassing the active layer 10. Differences from the semiconductor laser 100 and the semiconductor laser device 200 of Embodiment 1 will be mainly described.

A top view of the semiconductor laser device 200 is the same as that shown in FIG. 3. However, the fracture surface 12 shown in FIG. 3 corresponds to a fracture surface 12b shown in FIG. 35. A fracture surface 12a corresponds to that disposed below the fracture surface 12 in FIG. 3. The cross section of the semiconductor laser 100 and the semiconductor laser device 200 shown in FIG. 36 is the cross section taken along the fracture surface 12a shown in FIG. 35. The cross section of the semiconductor laser 100 and the semiconductor laser device 200 shown in FIG. 37 is the cross section taken along the fracture surface 12b shown in FIG. 35. FIG. 35 shows the semiconductor laser 100 provided with a first example of the conductive member 90 shown in FIG. 38. In the first example of the conductive member 90, part thereof on the first electrode 20 side on both side faces in the x-direction, that is, part on the front facet 101 side and part on the rear facet 102 side are formed so as to recede to the respective opposite facet sides, and four receding portions 80 are formed in which at least part of the conductive member 90 recedes from the front facet 101 and the rear facet 102 in the semiconductor structure part 2 to the respective other facet sides in the x-direction. Two receding portions 80 are formed on the front facet 101 side, and two receding portions 80 are formed on the rear facet 102 side.

A tip main part 85 is formed between two receding portions 80 in the y-direction on the front facet 101 side, and a tip main part 85 is formed between two receding portions 80 in the y-direction on the rear facet 102 side. FIG. 35 also shows tip main part side faces 86, which are side faces of the tip main parts 85 in the x-direction, and also tip main part side faces 87, which are side faces of the tip main parts 85 in the y-direction. As described in Embodiment 1, the receding portions 80 are also portions where the thickness of the conductive member 90 is reduced in the z-direction at the tip on the positive side in the x-direction and the tip on the negative side in the x-direction, and the portions where the thickness of the conductive member 90 is reduced in the z-direction are also the extended parts 92 extending from the main part 91. The portion between the broken lines 13b and 13c is the main part 91. The portions between the broken line 13a and the broken line 13b and between the broken line 13c and the broken line 13d, excluding the tip main parts 85, are the extended parts 92 and the receding portions 80. The broken lines 13a and 13d are broken lines along the extended part side faces 98 of the extended parts 92 and the tip main part side faces 86 of the tip main parts 85, and the broken lines 13b and 13c are broken lines along the main part side faces 97 of the main part 91. A broken line 17a is the broken line along the tip main part side face 87 of the tip main part 85 on the side of the front facet 101 on the positive side in the y-direction, and a broken line 17b is the broken line along the tip main part side face 87 of the tip main part 85 on the side of the front facet 101 on the negative side in the y-direction. A broken line 17c is the broken line along the tip main part side face 87 of the tip main part 85 on the side of the rear facet 102 on the positive side in the y-direction, and a broken line 17d is the broken line along the tip main part side face 87 of the tip main part 85 on the side of the rear facet 102 on the negative side in the y-direction. Note that, although the main part 91 and the tip main part 85 are distinguished from each other, the thickness of the tip main part 85 in the z-direction is the same as that of the main part 91, and the tip main part 85 can be regarded as part of the main part 91. In the semiconductor laser 100 of Embodiment 5, the main part (main part 91 including tip main parts 85), which is thicker in the z-direction than the extended parts 92 of the conductive member 90, is formed so as to encompass the active layer 10; that is, it is formed so as to encompass the surface side of the active layer 10 opposite to the semiconductor substrate 1.

The length in the y-direction of the receding portion 80 formed on the front facet 101 side on the negative side in the y-direction and the length in the y-direction of the receding portion 80 formed on the rear facet 102 side on the negative side in the y-direction are the same as the extension length Ly1, which is the length in the y-direction of the extended part 92 formed on the front facet 101 side on the negative side in the y-direction and the length in the y-direction of the extended part 92 formed on the rear facet 102 side on the negative side in the y-direction. The length in the y-direction of the receding portion 80 formed on the front facet 101 side on the positive side in the y-direction and the length in the y-direction of the receding portion 80 formed on the rear facet 102 side on the positive side in the y-direction are the same as the extension length Ly2, which is the length in the y-direction of the extended part 92 formed on the front facet 101 side on the positive side in the y-direction and the length in the y-direction of the extended part 92 formed on the rear facet 102 side on the positive side in the y-direction. The length in the y-direction of the receding portion 80 formed on the negative side in the y-direction on the front facet 101 side is the length from the broken line 17b to the side face of the main part 91 on the negative side in the y-direction, and the length in the y-direction of the receding portion 80 formed on the negative side in the y-direction on the rear facet 102 side is the length from the broken line 17d to the side face of the main part 91 on the negative side in the y-direction. The length in the y-direction of the receding portion 80 formed on the positive side in the y-direction on the front facet 101 side is the length from the broken line 17a to the side face of the main part 91 on the positive side in the y-direction, and the length in the y-direction of the receding portion 80 formed on the positive side in the y-direction on the rear facet 102 side is the length from the broken line 17c to the side face of the main part 91 on the positive side in the y-direction.

The length of the two receding portions 80 formed on the front facet 101 side in the x-direction is the same as the length of the tip main part 85 formed on the front facet 101 side in the x-direction, that is, a tip main part length Ld1. The tip main part length Ld1 is also the length in the two extended parts 92 formed on the front facet 101 side. The length of the two receding portions 80 formed on the rear facet 102 side in the x-direction is the same as the length of the tip main part 85 formed on the rear facet 102 side in the x-direction, that is, the tip main part length Ld2. The tip main part length Ld2 is also the length in the two extended parts 92 formed on the rear facet 102 side. The length in the x-direction of the two receding portions 80 and the tip main part 85 formed on the front facet 101 side is the length from the broken line 13a to the broken line 13b. The length of the two receding portions 80 and the tip main part 85 formed on the rear facet 102 side in the x-direction is the length from the broken line 13c to the broken line 13d. The lengths Ly1 and Ly2 of the receding portions 80 in the y-direction may be the same or different. The lengths Ld1 and Ld2 of the receding portions 80 and the tip main parts 85 in the x-direction may be the same or different.

In the first example of the conductive member 90, the main part side faces 97, which are in the two side faces opposed to each other in the x-direction on the surface electrode side and are at least part in the y-direction perpendicular to the x-direction and the z-direction, recede toward the respective opposite facet sides in the x-direction (front facet 101 side and rear facet 102 side) of the semiconductor structure part 2, the z-direction being perpendicular to the semiconductor substrate 1. In addition, the first example of the conductive member 90 includes the main part 91 and the extended parts 92 extending in the x-direction and at least partly in the y-direction on the surface electrode side in the two opposed side face to each other in the main part 91 in the x-direction. In the first example of the conductive member 90, the receding portions 80 that recede from the front facet 101 and the rear facet 102 to the respective opposite facet sides in the x-direction are formed, the front facet being the emission facet, the rear facet being the other facet. The receding portions 80 includes the extended part surfaces 96, which are the surfaces of the extended parts 92 opposite to the semiconductor substrate 1, and the side faces of the main part 91 (main part side faces 97, tip main part side faces 87) connected to the extended part surfaces 96. The receding portion 80 formed in the first example of the conductive member 90 does not pass through the two opposed side faces of the conductive member 90 in the y-direction.

The semiconductor laser 100 and the semiconductor laser device 200 of Embodiment 5, which are provided with the first example of the conductive member 90, are different from the first example of the semiconductor laser 100 of Embodiment 1 in that the tip main parts 85 that encompass the active layer 10 in the conductive member 90 on the front facet 101 side and the rear facet 102 side are provided, and other structures are the same as those of the first example of the semiconductor laser 100 and the semiconductor laser 200 of Embodiment 1. Therefore, the semiconductor laser 100 of Embodiment 5 including the first example of the conductive member 90 exhibits the same effects as those of the semiconductor laser 100 and the semiconductor laser device 200 of Embodiment 1. Since the receding portions 80 is formed in which at least part of the side faces of the front facet 101 side and the rear facet 102 side in the first example of the conductive member 90 recede from the front facet 101 and the rear facet 102 to the respective other facet sides in the x-direction, the receding portions 80 can absorb the bonding member 40 sticking out from the main part 91 at the time of junction down mounting, and can prevent the bonding member 40 from coming around the front facet 101 and the rear facet 102. FIG. 36 and FIG. 37 show an example in which the bonding member 40a that sticks out from the main part 91 and is from the bonding member 40 is bonded to the main part side faces 97 of the receding portions 80, and the bonding member 40 is not bonded to the tip main part side faces 86, which are the side faces in the x-direction of the tip main parts 85.

The conductive member 90 is, for example, a plating layer, and the conductive layers 31 and 32 are plating layers. The first example of the conductive member 90 can be formed by, for example, a two-step plating method as described in Embodiment 1. The method of performing the plating process a plurality of times enables easy manufacturing as compared with the case where the receding portion 80 is formed by etching, so that the mass productivity can be improved. Further, the receding portion 80 of the conductive member 90 can be formed by etching.

Although the first example of the conductive member 90 shown in FIG. 38 shows an example in which a total of four receding portions 80 are formed on the front facet 101 side and the rear facet 102 side, the number of receding portions 80 is not limited to four. In the second example of the conductive member 90 shown in FIG. 39, one receding portion is formed on the front facet 101 side. In the third example of the conductive member 90 shown in FIG. 40, two receding portions 80 are formed on the front facet 101 side. The fourth example of the conductive member 90 shown in FIG. 41 is an example in which two receding portions 80 are formed on the front facet 101 side and one receding portion 80 is formed on the rear facet 102 side. Like the second example of the conductive member 90 of Embodiment 1 shown in FIG. 7, the second example and the third example of the conductive member 90 are examples in which the receding portion 80 is formed only on one facet side.

In FIG. 39, the tip main part 85 covers a range in the x-direction from the broken line 13a to the broken line 13b, and a range in the y-direction from the broken line 17b to the side face of the main part 91 on the positive side in the y-direction. In FIG. 40, the tip main part 85 is the same as the tip main part 85 on the positive side in the x-direction in FIG. 38. In FIG. 41, the tip main part 85 on the positive side in the x-direction is the same as the tip main part 85 on the positive side in the x-direction in FIG. 38. In FIG. 41, the tip main part 85 on the negative side in the x-direction coves a range in the x-direction from the broken line 13c to the broken line 13d, and a range in the y-direction from the broken line 17d to the side face of the main part 91 on the positive side in the y-direction.

The semiconductor laser 100 and the semiconductor laser device 200 of Embodiment 5 provided with the second and third examples of the conductive member 90 exhibit the same effects as those of the second example of the semiconductor laser 100 and the semiconductor laser device 200 of Embodiment 1 shown in FIG. 7. The semiconductor laser 100 and the semiconductor laser device 200 of Embodiment 5 provided with the fourth example of the conductive member 90 exhibit the same effects as those of the first example of the semiconductor laser 100 and the semiconductor laser device 200 of Embodiment 1.

Although FIG. 35 to FIG. 41 show the examples for the receding portions 80 with one stage, the semiconductor laser 100 and the semiconductor laser device 200 of Embodiment 5 may include the receding portions 80 with two or more stages as shown in FIG. 8. In addition, in the semiconductor laser 100 and the semiconductor laser device 200 of Embodiment 5, the grooves 60 shown in Embodiment 2 may be formed in the conductive member 90, and the adhesion preventing member 72 shown in Embodiment 3 may be formed in the receding portions 80.

Embodiment 6

Figure 42:
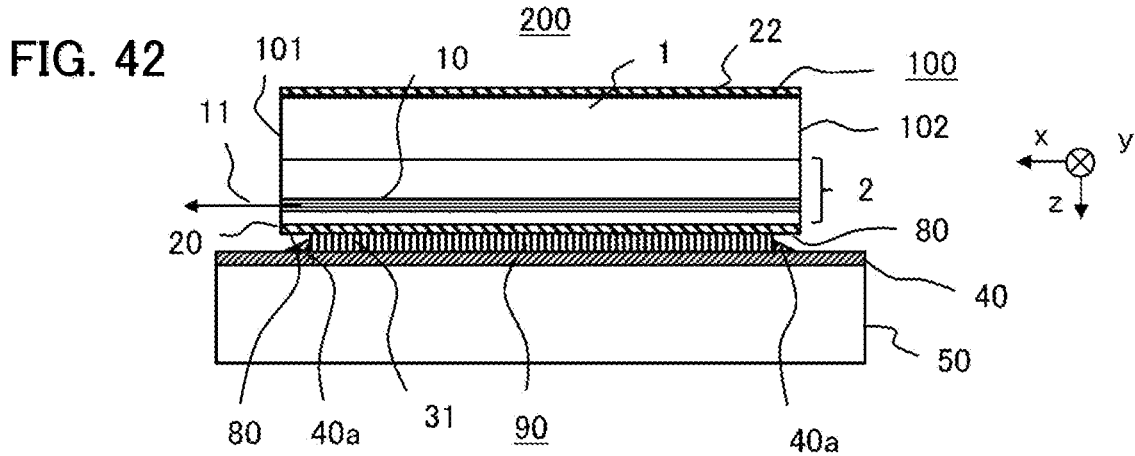
FIG. 42 is a cross-sectional view showing a first example of a semiconductor laser and a semiconductor laser device according to Embodiment 6.
Figure 43:
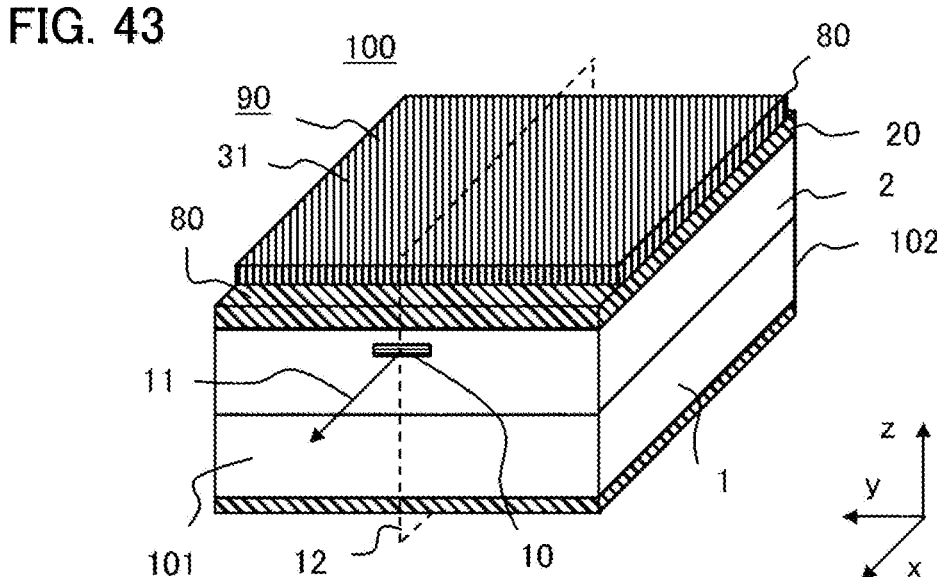
FIG. 43 is a perspective view of a first example of the semiconductor laser according to Embodiment 6.
Figure 44:
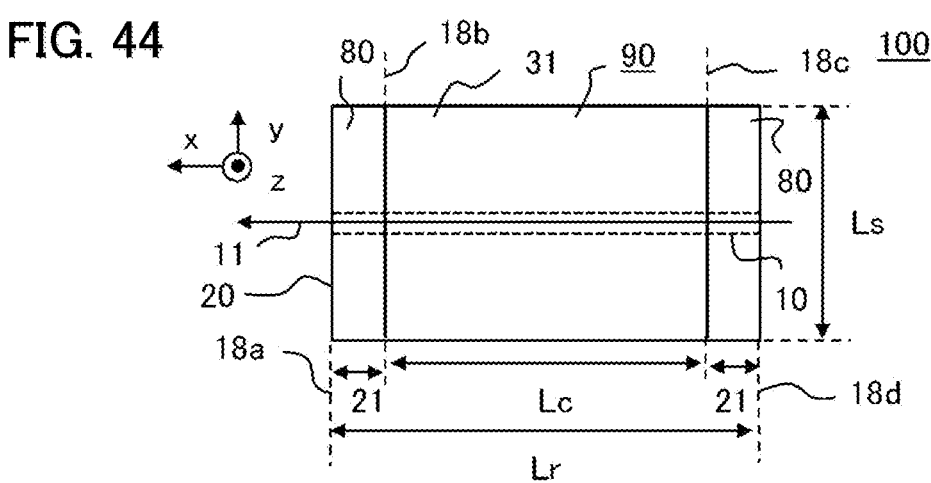
FIG. 44 is a plan view showing a first example of the semiconductor laser according to Embodiment 6.
Figure 45:
FIG. 45 is a diagram for explaining a method of forming the first example of the conductive member according to Embodiment 6.
Figure 46:
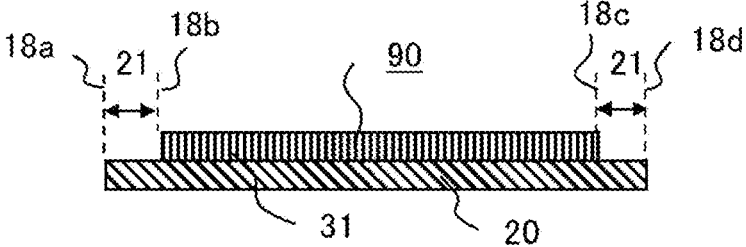
FIG. 46 is a diagram for explaining the method of forming the first example of the conductive member according to Embodiment 6.
Figure 47:
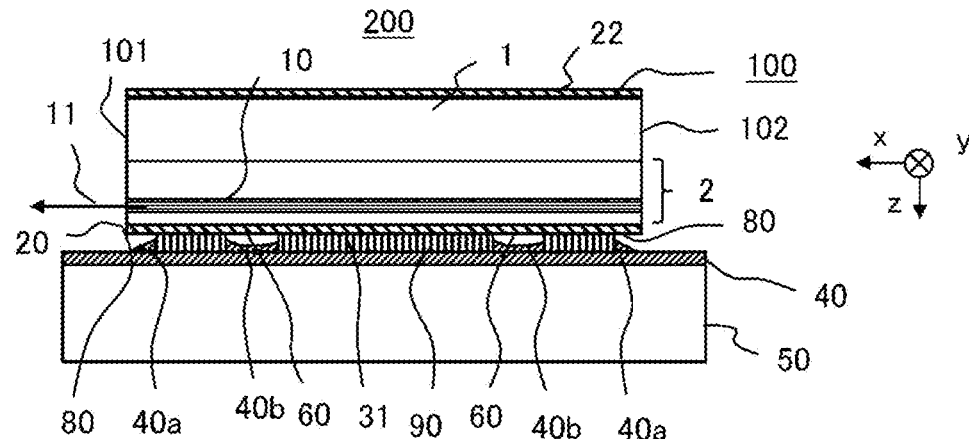
FIG. 47 is a cross-sectional view showing a second example of the semiconductor laser and the semiconductor laser device according to Embodiment 6.
Figure 48:
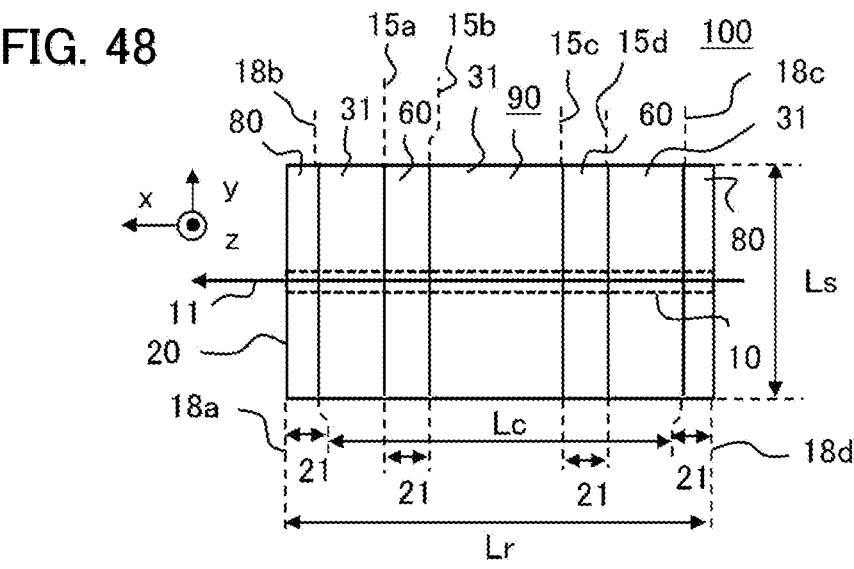
FIG. 48 is a plan view showing the second example of the semiconductor laser according to Embodiment 6.
Figure 49:
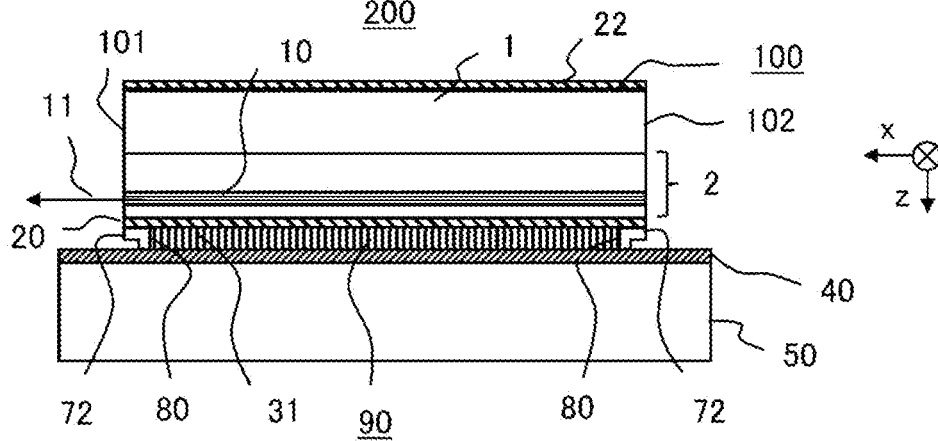
FIG. 49 is a cross-sectional view showing a third example of the semiconductor laser and the semiconductor laser device according to Embodiment 6.
Figure 50:
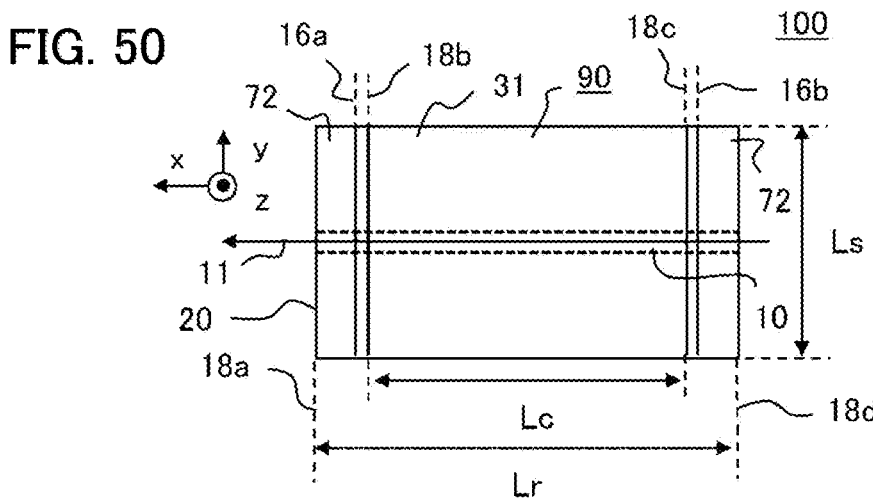
FIG. 50 is a plan view showing the third example of the semiconductor laser according to Embodiment 6.

FIG. 42 is a cross sectional view showing a first example of a semiconductor laser and a semiconductor laser device according to Embodiment 6, and FIG. 43 is a perspective view of the first example of the semiconductor laser according to Embodiment 6. FIG. 44 is a plan view showing the first example of the semiconductor laser according to Embodiment 6. FIG. 45 and FIG. 46 are diagrams for explaining a method of forming a first example of the conductive member according to Embodiment 6, respectively. FIG. 47 is a cross sectional view showing a second example of the semiconductor laser and the semiconductor laser device according to Embodiment 6, and FIG. 48 is a plan view showing the second example of the semiconductor laser according to Embodiment 6. FIG. 49 is a cross sectional view showing a third example of the semiconductor laser and the semiconductor laser device according to Embodiment 6, and FIG. 50 is a plan view showing the third example of the semiconductor laser according to Embodiment 6. FIG. 51 is a plan view showing a fourth example of the semiconductor laser according to Embodiment 6. FIG. 52 is a cross sectional view including a cross section of the receding portions in the fourth example of the semiconductor laser and the semiconductor laser device according to Embodiment 6, and FIG. 53 is a cross sectional view including a cross section of the tip main parts in the fourth example of the semiconductor laser and the semiconductor laser device according to Embodiment 6. The semiconductor laser 100 and the semiconductor laser device 200 of Embodiment 6 are different from the semiconductor laser 100 and the semiconductor laser device 200 of Embodiment 1 to Embodiment 5 in that the receding portions 80 are not formed in the conductive member 90 and the receding portions 80 are formed in which part of or the whole of the side face on the front facet 101 side, which is one side face of the conductive member 90 in the x-direction, recedes from the front facet 101 in the semiconductor structure part 2 to the rear facet 102 side therein, which is the other facet side in the x-direction. Differences from the semiconductor laser 100 and the semiconductor laser device 200 of Embodiment 1 to Embodiment 5 will be mainly described.

With reference to FIG. 42 to FIG. 46, the first example of the semiconductor laser 100 and the semiconductor laser device 200 of Embodiment 6 will be described. In the first example of the semiconductor laser 100 and the semiconductor laser device 200 of Embodiment 6, the receding portions 80 are formed in which the whole of the two side faces of the conductive member 90 in the x-direction recede from the front facet 101 in the semiconductor structure part 2 and the rear facet 102 therein to the respective other facet sides in the x-direction. The conductive member 90 in the first example of Embodiment 6 does not include the extended parts 92 but is formed only as the main part 91. As shown in the plan view of the semiconductor laser 100 shown in FIG. 44, both end sides of the first electrode 20 in the x-direction are exposed. The range from a broken line 18a to a broken line 18b and the range from a broken line 18c to a broken line 18d correspond to first electrode exposed portions 21 in which the first electrode 20 is exposed. The broken line 18b is a boundary along the side face in the conductive member 90 on the positive side in the x-direction, that is, the broken line along the main part side face 97, the side face being receded toward the opposite side face, and the broken line 18c is a boundary along the side face in the conductive member 90 on the negative side in the x-direction, that is, the broken line along the main part side face 97, the side face being receded toward the opposite side face. Therefore, the range from the broken line 18a to the broken line 18b and the range from the broken line 18c to the broken line 18d correspond to the receding portions 80. FIG. 44 also shows a laser length Lr, which is the length of the semiconductor laser 100 in the x-direction, a conductive member length Lc, which is the length of the conductive member 90 in the x-direction, and a receding portion length Ls, which is the length of the receding portion 80 in the y-direction equal to the length of the conductive member 90 in the y-direction.

In the first example of the conductive member 90 of Embodiment 6, the conductive member length Lc is shorter than the length in the direction of the resonator of the semiconductor laser 100, that is, the laser length Lr, and in the first example of the semiconductor laser 100 of Embodiment 6, the receding portions 80 are formed on the front facet 101 side and the rear facet 102 side of the semiconductor structure part 2, so that, similarly to the semiconductor laser 100 of Embodiment 1, the receding portions 80 can absorb the bonding member 40 sticking out from the main part 91 at the time of junction down mounting, and it is possible to prevent the bonding member 40 from coming around the front facet 101 and the rear facet 102.

The conductive member 90 is, for example, a plating layer, and the conductive layer 31 is a plating layer. The first example of the conductive member 90 can be formed by, for example, a plating method. The first electrode 20 on the surface of the semiconductor structure part 2 opposite to the semiconductor substrate 1 and the second electrode 22 on the rear surface of the semiconductor substrate 1 opposite to the semiconductor structure part 2 are formed by a metal sputtering process. As shown in FIG. 45, the resist pattern 41 is formed on the surface of the first electrode 20 so that portions to be formed as the receding portions 80 are covered with the resist. The portions shown between the broken line 18a and the broken line 18b and between the broken line 18c and the broken line 18d are portions where the receding portions 80 are to formed. The conductive layer 31 is formed by a plating process on the surface of the first electrode 20 exposed from the opening of the resist pattern 41. By removing the resist pattern 41, the conductive member 90 adjacent to the receding portions 80 is formed on the surface of the first electrode 20 as shown in FIG. 46. The first example of the conductive member 90 of Embodiment 6 can reduce the number of plating processes and enables easy manufacturing as compared with the two-step plating method in the first example of the conductive member 90 of Embodiment 1, so that the mass productivity is improved.

In the first example of the conductive member 90 of Embodiment 6, the main part side faces 97, which are the whole of the two side faces opposed to each other in the x-direction, recede toward respective opposite facet sides in the x-direction (front facet 101 side and rear facet 102 side) in the semiconductor structure part 2. The conductive member 90 of Embodiment 6 may include the groove 60 described in Embodiment 2 and the tip main part 85 described in Embodiment 5, and the adhesion preventing member 72 described in Embodiment 3 may cover the receding portions 80 including the main part side faces 97 of the conductive member 90. In the second example of the semiconductor laser 100 and the semiconductor laser device 200 of Embodiment 6 shown in FIG. 47 and FIG. 48, the conductive member 90 is provided with the grooves 60. In the third example of the semiconductor laser 100 and the semiconductor laser device 200 of Embodiment 6 shown in FIG. 49 and FIG. 50, the adhesion preventing member 72 covers the receding portions 80. The fourth example of the semiconductor laser 100 and the semiconductor laser device 200 of Embodiment 6 shown in FIG. 51, FIG. 52, and FIG. 53 is an example in which the conductive member 90 includes the tip main parts 85.

In the second example of the semiconductor laser 100 and the semiconductor laser device 200 of Embodiment 6 shown in FIG. 47 and FIG. 48, the conductive member 90 includes the grooves 60 each passing through two side faces opposed to each other in the y-direction. As in the first example of the conductive member 90 of Embodiment 6 described above, the receding portions 80 and the grooves 60 are formed in one plating process. In FIG. 47 and FIG. 48, the bottom surfaces of the grooves 60 are the first electrode exposed portions 21 of the first electrode 20. The groove 60 covers a range from the broken line 15a to the broken line 15b and a range from the broken line 15c to the broken line 15d. Note that, as described in Embodiment 2, in combination with the etching process, the bottom surfaces of the grooves 60 may be the bottom surfaces of the recesses of the conductive layer 31. In this case, the first electrode 20 is not exposed in the grooves 60. As shown in FIG. 24 and FIG. 25, the number of grooves 60 may be three or more, or the grooves 60 may extend in a direction inclined with respect to the y-direction. Further, as shown in FIG. 26, the groove 60 may not pass through two opposed side faces to each other in the y-direction in the conductive member 90, but may extend from one side face in the y-direction on the other side face side in the y-direction. In the second example of the semiconductor laser 100 and the semiconductor laser device 200 of Embodiment 6, since the conductive member 90 includes the grooves 60, the same effects as those of the semiconductor laser 100 and the semiconductor laser device 200 of Embodiment 2 can be obtained.

In the third example of the semiconductor laser 100 and the semiconductor laser device 200 of Embodiment 6 shown in FIG. 49 and FIG. 50, the adhesion preventing member 72 covers the receding portions 80. The adhesion preventing member 72 covers the first electrode exposed portion 21 and the main part side face 97 in the receding portion 80, ranging from the broken line 18a to the broken line 18b, and covers the first electrode exposed portion 21 and the main part side face 97 in the receding portion 80, ranging from the broken line 18c to the broken line 18d. In the adhesion preventing member 72, the portion from the broken line 16a to the broken line 18b and the portion from the broken line 16b to the broken line 18c cover the main part side faces 97 in the receding portions 80. As with the semiconductor laser 100 and semiconductor laser device 200 of Embodiment 4, the semiconductor laser 100 and the semiconductor laser device 200 of Embodiment 6 may be in the combination of the third example and the second example. In the third example of the semiconductor laser 100 and the semiconductor laser device 200 of Embodiment 6, since the adhesion preventing member 72 covers the receding portions 80, the same effects as those of the semiconductor laser 100 and the semiconductor laser device 200 of Embodiment 3 can be obtained.

In the fourth example of the semiconductor laser 100 and the semiconductor laser device 200 of Embodiment 6 shown in FIG. 51 to FIG. 53, the tip main part 85 is formed between the two receding portions 80 in the y-direction on the front facet 101 side, and the tip main part 85 is formed between the two receding portions 80 in the y-direction on the rear facet 102 side. The portion between the broken line 18b and the broken line 18c is the main part 91. The portions between the broken line 18a and the broken line 18b and between the broken line 18c and the broken line 18d, excluding the tip main parts 85, are the receding portions 80. The broken lines 18a and 18d are broken lines along the side faces of the first electrode 20 in the x-direction and the side faces of the tip main parts 85, and the broken lines 18b and 18c are broken lines along the main part side faces 97 of the main part 91. Although the main part 91 and the tip main part 85 are distinguished from each other, the thickness of the tip main part 85 in the z-direction is the same as that of the main part 91, and the tip main part 85 can be regarded as part of the main part 91. In the fourth example of the semiconductor laser 100 of Embodiment 6, the conductive member 90 (main part 91 including tip main parts 85) is formed so as to encompass the active layer 10; that is, it is formed so as to encompass the surface side of the active layer 10 opposite to the semiconductor substrate 1.

The length in the y-direction of the receding portion 80 formed on the front facet 101 side on the negative side in the y-direction and the length in the y-direction of the receding portion 80 formed on the rear facet 102 side on the negative side in the y-direction are referred to as a receding portion length Ls1. The length in the y-direction of the receding portion 80 formed on the front facet 101 side on the positive side in the y-direction and the length in the y-direction of the receding portion 80 formed on the rear facet 102 side on the positive side in the y-direction are referred to as a receding portion length Ls2. The length in the y-direction of the receding portion 80 formed on the negative side in the y-direction on the front facet 101 side is the length from the broken line 17b to the side face of the main part 91 on the negative side in the y-direction, and the length in the y-direction of the receding portion 80 formed on the negative side in the y-direction on the rear facet 102 side is the length from the broken line 17d to the side face of the main part 91 on the negative side in the y-direction. The length in the y-direction of the receding portion 80 formed on the positive side in the y-direction on the front facet 101 side is the length from the broken line 17a to the side face of the main part 91 on the positive side in the y-direction, and the length in the y-direction of the receding portion 80 formed on the positive side in the y-direction on the rear facet 102 side is the length from the broken line 17c to the side face of the main part 91 on the positive side in the y-direction.

The length of the two receding portions 80 formed on the front facet 101 side in the x-direction is the same as the length of the tip main part 85 formed on the front facet 101 side in the x-direction, that is, the tip main part length Ld1. The tip main part length Ld1 is also the length in the two receding portions 80 formed on the front facet 101 side. The length of the two receding portions 80 formed on the rear facet 102 side in the x-direction is the same as the length of the tip main part 85 formed on the rear facet 102 side in the x-direction, that is, the tip main part length Ld2. The front end main body length Ld2 is also the length in the two receding portions 80 formed on the rear facet 102 side. The length in the x-direction in the two receding portions 80 and the tip main part 85 that are formed on the front facet 101 side is the length from the broken line 18a to the broken line 18b. The length in the x-direction in the two receding portions 80 and the tip main part 85 that are formed on the rear facet 102 side is the length from the broken line 18c to the broken line 18d. The lengths Ls1 and Ls2 of the receding portions 80 in the y-direction may be the same or different. The lengths Ld1 and Ld2 of the receding portion 80 and the tip main part 85 in the x-direction may be the same or different.

In the fourth example of the conductive member 90 of Embodiment 6, the main part side faces 97, which are in the two side faces opposed to each other in the x-direction and are at least part thereof in the y-direction perpendicular to the x-direction and the z-direction, recede toward the respective opposite facet sides in the x-direction (front facet 101 side and rear facet 102 side) in the semiconductor structure part 2, the z-direction being perpendicular to the semiconductor substrate 1. In the semiconductor laser 100 and the semiconductor laser device 200 provided with the fourth example of the conductive member 90 of Embodiment 6, the receding portion 80 does not pass through the two opposed side faces to each other in the conductive member 90 in the y-direction.

Although the fourth example of the conductive member 90 of Embodiment 6 shown in FIG. 51 shows an example in which a total of four receding portions 80 are formed on the front facet 101 side and the rear facet 102 side, the number of the receding portions 80 is not limited to four. As shown in FIG. 39 to FIG. 41, one to three receding portions 80 may be used. As shown in FIG. 39 and FIG. 40, the examples in which the receding portion 80 is formed only on the front facet 101 side correspond to the example in which the receding portion 80 is formed only on one facet side, similarly to the second example of the conductive member 90 of Embodiment 1 shown in FIG. 7. In the fourth example of the conductive member 90 of Embodiment 6 in a case which the receding portion 80 is formed only on one facet side, the main part side face 97, which is in the side face of the emission facet side (front facet 101 side) and is at least part thereof in the y-direction perpendicular to the x-direction and the z-direction, recedes toward the facet side (rear facet 102 side) in the semiconductor structure part 2 on the opposite side in the x-direction, the z-direction being perpendicular to the semiconductor substrate 1.

In the fourth example of the semiconductor laser 100 and the semiconductor laser device 200 of Embodiment 6, the conductive member 90 (main part 91 including tip main parts 85) is formed so as to encompass the active layer 10; that is, it is formed so as to encompass the surface side of the active layer 10 opposite to the semiconductor substrate 1, and therefore the same effects as those of the semiconductor laser 100 and the semiconductor laser device 200 of Embodiment 5 can be obtained.

As described above, the semiconductor laser 100 of Embodiment 6 is provided with the semiconductor substrate 1, the semiconductor structure part 2 that is formed on the surface of the semiconductor substrate 1 and includes the active layer 10 for generating light emitted from the emission facet (front facet 101), the surface electrode (first electrode 20) formed on the surface of the semiconductor structure part 2 opposite to the semiconductor substrate 1, and the conductive member 90 formed on the surface of the surface electrode (first electrode 20) opposite to the semiconductor substrate 1. In the conductive member 90, part of or the whole of the side face (main part side face 97) on the emission facet side (front facet 101 side), which is one side face in the x-direction parallel to the extending direction in which the active layer 10 extends, is formed away from the emission facet (front facet 101) in the semiconductor structure part 2 toward the other facet side (rear facet 102 side) opposite to the emission facet (front facet 101) in the x-direction. In the semiconductor laser 100, the receding portion 80 is formed in which at least part of the conductive member 90 (main part side face 97) recedes from the emission facet (front facet 101) to the other facet side (rear facet 102 side) in the x-direction. In the semiconductor laser 100 of Embodiment 6, with the structure described above, since the receding portion 80 is formed such that at least part of the side faces (main part side face 97) of the conductive member 90 on the emission facet side (front facet 101 side) recedes from the emission facet (front facet 101) toward the other facet side (rear facet 102 side) in the x-direction, it is possible to prevent the bonding member 40 from coming around the light emission facet (front facet 101) at the time of junction down mounting.

The semiconductor laser device 200 of Embodiment 6 includes the semiconductor laser 100 and the submount 50 on which the semiconductor laser 100 is mounted, and the conductive member 90 of the semiconductor laser 100 is bonded to the submount 50 with the bonding member 40. The semiconductor laser 100 is provided with the semiconductor substrate 1, the semiconductor structure part 2 that is formed on the surface of the semiconductor substrate 1 and includes the active layer 10 for generating light emitted from the emission facet (front facet 101), the surface electrode (first electrode 20) formed on the surface of the semiconductor structure part 2 opposite to the semiconductor substrate 1, and the conductive member 90 formed on the surface of the surface electrode (first electrode 20) opposite to the semiconductor substrate 1. In the conductive member 90, part of or the whole of the side face (main part side face 97) on the emission facet side (front facet 101 side), which is one side face in the x-direction parallel to the extending direction in which the active layer 10 extends, is formed away from the emission facet (front facet 101) in the semiconductor structure part 2 toward the other facet side (rear facet 102 side) opposite to the emission facet (front facet 101) in the x-direction. In the semiconductor laser 100, the receding portion 80 is formed in which at least part of the conductive member 90 (main part side face 97) recedes from the emission facet (front facet 101) to the other facet side (rear facet 102 side) in the x-direction. On the two side faces opposed to each other in the x-direction in the conductive member 90, the bonding member 40 is bonded on the submount 50 side away from the boundary between the conductive member 90 and the surface electrode (first electrode 20) in the semiconductor laser 100. In the semiconductor laser device 200 of Embodiment 6, with the structure described above, since the receding portion 80 is formed such that at least part of the side faces (main part side face 97) of the conductive member 90 on the emission facet side (front facet 101 side) recedes from the emission facet (front facet 101) toward the other facet side (rear facet 102 side) in the x-direction, it is possible to prevent the bonding member 40 from coming around the light emission facet (front facet 101) at the time of junction down mounting.

Embodiment 7

Figures 54, 55:
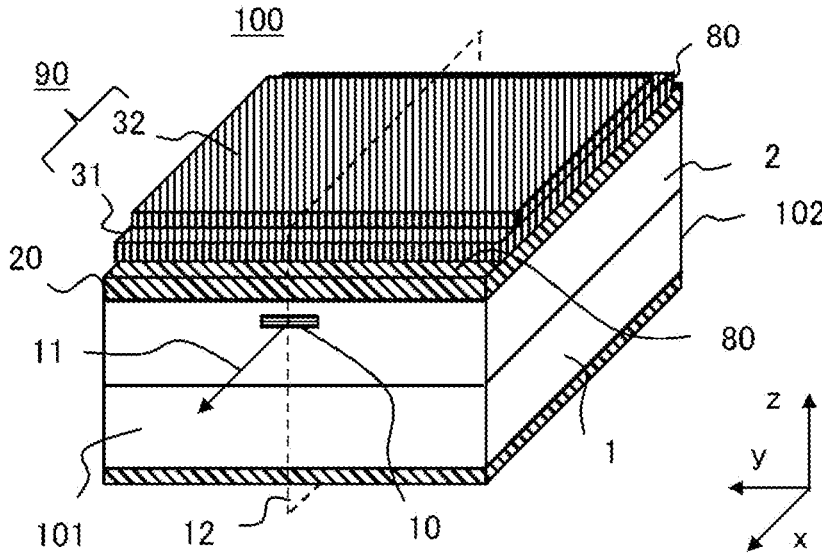
FIG. 54 is a cross-sectional view showing a semiconductor laser and a semiconductor laser device according to Embodiment 7.
FIG. 55 is a perspective view of the semiconductor laser according to Embodiment 7.
Figure 56:
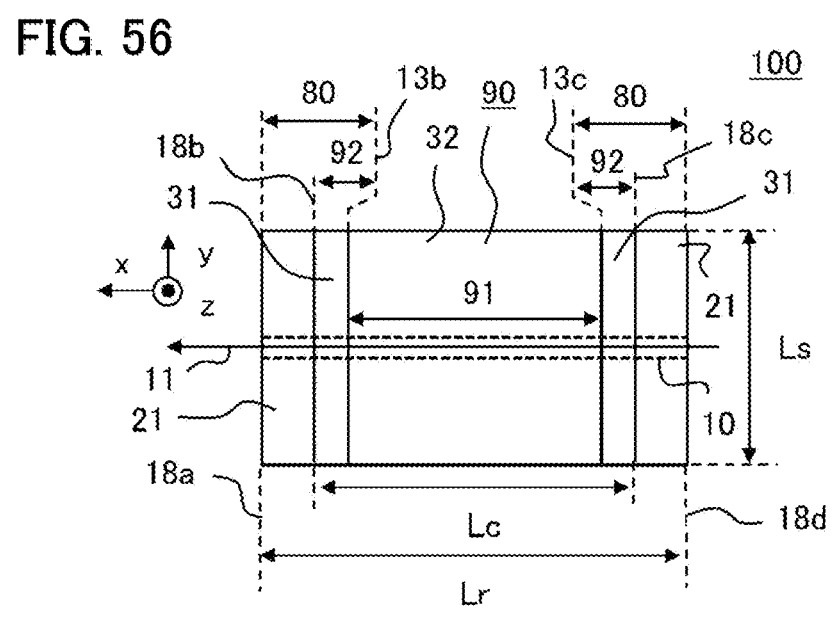

In the semiconductor laser 100 and the semiconductor laser device 200 of Embodiment 1 to Embodiment 4, although the examples are described in which the conductive member length Lc of the conductive member 90 is equal to the length in the resonator direction of the semiconductor laser 100, that is, the laser length Lr, the conductive member length Lc may be shorter than the laser length Lr. FIG. 54 is a cross sectional view showing a semiconductor laser and a semiconductor laser device according to Embodiment 7, and FIG. 55 is a perspective view of the semiconductor laser according to Embodiment 7. FIG. 56 is a plan view of the semiconductor laser of FIG. 55. FIG. 54 to FIG. 56 show an example in which the conductive member length Lc of the conductive member 90 in the first example of the semiconductor laser 100 and the semiconductor laser device 200 of Embodiment 1 is made shorter than the laser length Lr. Differences from the semiconductor laser 100 and the semiconductor laser device 200 of Embodiment 1 will be mainly described.

In the semiconductor laser 100 and the semiconductor laser device 200 of Embodiment 7, the receding portions 80 is formed in which the whole of two side faces of the conductive member 90 in the x-direction recedes from the front facet 101 and the rear facet 102 in the semiconductor structure part 2 to the respective other facet sides in the x-direction, and the receding portions 80 are formed also in the conductive member 90. As shown in the plan view of the semiconductor laser 100 shown in FIG. 56, the first electrode exposed portions 21, which are part of the first electrode 20, are exposed at both ends in the x-direction. The range from the broken line 18a to the broken line 18b and the range from the broken line 18*c* to the broken line 18*d* correspond to the first electrode exposed portions 21 in which the first electrode 20 is exposed. The range from the broken line 18*b* to the broken line 13*b* and the range from the broken line 18*c* to the broken line 13*c* correspond to the first extended parts 92 of the conductive member 90. The broken line 18*b* is a boundary where the side face in the conductive member 90 on the positive side in the x-direction has receded to the opposite side face side, that is, the broken line along the extended part side face 98, and the broken line 18*c* is a boundary where the side face in the conductive member 90 on the negative side in the x-direction has receded to the opposite side face side, that is, the broken line along the extended part side face 98. The broken line 13*b* is a boundary where the main part 91 on the positive side in the x-direction of the conductive member 90 has receded to the opposite side face side, that is, the broken line along the main part side face 97, and the broken line 13*c* is a boundary where the main part 91 on the negative side in the x-direction of the conductive member 90 has receded to the opposite side face side, that is, the broken line along the main part side face 97. Therefore, the range from the broken line 18*a* to the broken line 13*b* and the range from the broken line 13*c* to the broken line 18*d* correspond to the receding portions 80. The range from the broken line 18*b* to the broken line 13*b* and the range from the broken line 13*c* to the broken line 18*c* correspond to the receding portions 80 formed in the conductive member 90. FIG. 56 also shows the laser length Lr, which is the length of the semiconductor laser 100 in the x-direction, the conductive member length Lc, which is the length of the conductive member 90 in the x-direction, and also the receding portion length Ls, which is the length of the receding portion 80 in the y-direction equal to the length of the conductive member 90 in the y-direction.

In the conductive member 90 of Embodiment 7, the receding portions 80 are formed on the front facet 101 side and the rear facet 102 side in the semiconductor structure part 2, and the conductive member length Lc is shorter than the length in the resonator direction of the semiconductor laser 100, that is, the laser length Lr. Therefore, in the semiconductor laser 100 of Embodiment 7, the range of the receding portions 80 formed on the front facet 101 side and the rear facet 102 side in the semiconductor structure part 2 can be enlarged as compared with the first example of the semiconductor laser 100 of Embodiment 1. Therefore, in the semiconductor laser 100 of Embodiment 7, the bonding member 40 sticking out from the main part 91 at the time of junction down mounting can be more absorbed by the receding portions 80 than in the first example of the semiconductor laser 100 of Embodiment 1, and the effects of preventing the bonding member 40 from coming around the front facet 101 and the rear facet 102 can be enhanced more than in the first example of the semiconductor laser 100 of Embodiment 1.

The conductive member 90 is, for example, a plating layer, and the conductive layers 31 and 32 are plating layers. The conductive member 90 can be formed by, for example, the two-step plating method. The semiconductor structure part 2 is formed in the semiconductor substrate 1, and the first electrode 20 on the surface of the semiconductor structure part 2 opposite to the semiconductor substrate 1 and the second electrode 22 on the rear surface of the semiconductor substrate 1 opposite to the semiconductor structure part 2 are formed by a metal sputtering process. A resist pattern is formed on the surface of the first electrode 20 such that portions other than the portion where the conductive layer 31 is formed are covered with the resist. Portions shown between the broken lines 18*a* and 18*b* and between the broken lines 18*c* and 18*d* are portions where the conductive layer 31 is not formed, and thus they are the portions where the first electrode 20 is exposed to be the first electrode exposed portion 21. The conductive layer 31 is formed by a first plating process on the surface of the first electrode 20 exposed from the opening of the resist pattern. Thereafter, a resist pattern is formed in which portions where the receding portions 80 are to be formed are covered with a resist. The conductive layer 32 is formed by a second plating process on the surface of the conductive layer 31 exposed from the opening of the resist pattern. The method of performing the plating process a plurality of times enables easy manufacturing as compared with the case where the receding portions 80 are formed by etching, so that the mass productivity can be improved. Note that, when the first plating process is performed, in order to facilitate formation of the front facet 101 and the rear facet 102 by cleavage, it is preferable to cover the portions to be cleaved with a resist so that the plating should not be formed thereon.

The receding portions 80 of the conductive member 90 may be formed by etching. A resist pattern is formed on the surface of the first electrode 20 so that portions other than the portion where the conductive layer 31 is formed are covered with a resist. The conductive layer 31 having a thickness of the main part height d1 is formed on the surface of the first electrode 20 exposed from the opening of the resist pattern by a plating process. A resist pattern is formed in which portions thereof where the receding portions 80 in the conductive member 90 are to be formed are opened. That is, the resist pattern having openings between the broken line 18*b* and the broken line 13*b* and between the broken line 18*c* and the broken line 13*c* is formed. Thereafter, the conductive layer 31 is etched until the height from the surface of the main part 91 to the extended part surface 96 of the extended part 92 reaches Δd, thereby forming the conductive member 90.

In FIG. 54 to FIG. 56, a modification of the first example of the semiconductor laser 100 and the semiconductor laser device 200 of Embodiment 1 has been described, but the conductive member 90 in which the conductive member length Lc is shorter than the laser length Lr can also be applied to the second and third examples of the semiconductor laser 100 and the semiconductor laser device 200 of Embodiment 1, and can also be applied to the semiconductor laser 100 and the semiconductor laser device 200 of Embodiment 2 to Embodiment 4. By the application of the conductive member 90 with the length Lc, which is shorter than the laser length Lr, the range of the receding portions 80 formed on the front facet 101 side and the rear facet 102 side in the semiconductor structure part 2 can be expanded as compared with the examples before the application. Therefore, in the semiconductor laser 100 and the semiconductor laser device 200 to which the conductive member 90 having the conductive member length Lc shorter than the laser length Lr is applied, the bonding member 40 sticking out from the main part 91 at the time of junction-down mounting can be absorbed by the receding portion 80 more than in the examples before the application, and the effects of preventing the bonding member 40 from coming around the front facet 101 and the rear facet 102 can be enhanced more than in the examples before the application.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor substrate, 2. semiconductor structure part, 10: active layer, 20: first electrode (surface electrode), 31: conductive layer, 32: conductive layer, 33: conductive layer, 40, 40a: bonding member, 50: submount, 60: groove, 72: adhesion preventing member, 80: receding portion, 90: conductive member, 91: main part, 92: extended part, 96, 96a, 96b: extended part surface, 97: main part side face, 100: semiconductor laser, 101: front facet, 102. rear facet, 200. semiconductor laser device, Δd: step height, Δg: groove depth

The invention claimed is:

1. A semiconductor laser comprising:

a semiconductor substrate;

a semiconductor structure part that is formed on a surface of the semiconductor substrate and includes an active layer for generating light emitted from an emission facet;

a surface electrode formed on a surface of the semiconductor structure part opposite to the semiconductor substrate; and a conductive member formed on a surface of the surface electrode opposite to the semiconductor substrate, wherein the conductive member is such that part of or the whole of a side face thereof on an emission facet side, the side face being one side face in an x-direction parallel to an extending direction in which the active layer extends, is formed to be away from the emission facet in the semiconductor structure part toward a side of the other facet opposed to the emission facet in the x-direction, and a receding portion is formed in the conductive member such that at least part of the conductive member recedes toward the side of the other facet in the x-direction from the emission facet, the conductive member comprises:

a main part; and an extended part extending in the x-direction and at least partly in a y-direction on a side of the surface electrode in a side face of the emission facet side in the main part, the y-direction being perpendicular to the x-direction and a z-direction, the z-direction being perpendicular to the semiconductor substrate, the receding portion including an extended part surface that is a surface on a side opposite to the semiconductor substrate in the extended part, and the side face of the main part connected to the extended part surface, the conductive member having a length in the x-direction shorter than a length of the semiconductor structure part in the x-direction, and the conductive member is flush with two side faces of the semiconductor structure part opposed to each other in the y-direction.

2. The semiconductor laser according to claim 1, wherein the conductive member is formed such that the main part encompasses the active layer.

3. The semiconductor laser according to claim 1, wherein the receding portion passes through two side faces of the conductive member opposed to each other in the y-direction.

4. The semiconductor laser according to claim 1, wherein the conductive member includes a groove passing through two side faces opposed to each other in the y-direction on a surface opposite to the semiconductor substrate.

5. The semiconductor laser according to claim 4, wherein the depth of the groove in the z-direction is different from the depth of the receding portion in the z-direction.

6. The semiconductor laser according to claim 1, wherein the conductive member includes a groove extending from one side face in the y-direction toward a side of the other side face in the y-direction on a surface opposite to the semiconductor substrate.

7. The semiconductor laser according to claim 1, wherein the conductive member in the whole of a side face on the emission facet side recedes toward the side of the other facet in the x-direction.

8. The semiconductor laser according to claim 1, wherein the conductive member is such that a side face thereof on the emission facet side at least partly in a y-direction recedes toward the side of the other facet in the x-direction, the y-direction being perpendicular to the x-direction and a z-direction, the z-direction being perpendicular to the semiconductor substrate.

9. The semiconductor laser according to claim 8, wherein the conductive member is formed to encompass the active layer.

10. The semiconductor laser according to claim 8, wherein the conductive member includes a groove passing through two side faces opposed to each other in the y-direction on a surface opposite to the semiconductor substrate.

11. The semiconductor laser according to claim 8, wherein the conductive member includes a groove extending from one side face in the y-direction toward the side of the other side face in the y-direction on a surface opposite to the semiconductor substrate.

12. The semiconductor laser according to claim 1, wherein the conductive member is a plating layer.

13. The semiconductor laser according to claim 1, wherein an adhesion preventing member that does not adhere to a bonding member and is used when the semiconductor laser and the submount are bonded is formed in the receding portion.

14. A semiconductor laser device comprising:

the semiconductor laser according to claim 13; and a submount on which the semiconductor laser is mounted, wherein the conductive member of the semiconductor laser is bonded to the submount with a bonding member, and the bonding member is not connected to a side face in the x-direction on which the adhesion preventing member is formed in the receding portion of the conductive member.

15. A semiconductor laser device comprising:

the semiconductor laser according to claim 1; and a submount on which the semiconductor laser is mounted, wherein the conductive member of the semiconductor laser is bonded to the submount with a bonding member, and the bonding member is bonded on a side of the submount away from a boundary between the surface electrode and the conductive member in the semiconductor laser on the two side faces opposed to each other in the x-direction in the conductive member.

16. A semiconductor laser comprising:

a semiconductor substrate;

a semiconductor structure part that is formed on a surface of the semiconductor substrate and includes an active layer for generating light emitted from an emission facet;

a surface electrode formed on a surface of the semiconductor structure part opposite to the semiconductor substrate; and a conductive member formed on a surface of the surface electrode opposite to the semiconductor substrate, wherein the conductive member is such that part of or the whole of a side face thereof on an emission facet side, the side face being one side face in an x-direction parallel to an extending direction in which the active layer extends, is formed to be away from the emission facet in the semiconductor structure part toward a side of the other facet opposed to the emission facet in the x-direction, part of or the whole of a side face thereof on the side of the other facet in the x-direction is formed toward the emission facet side, a receding portion is formed on the emission facet side of the conductive member such that at least part of the conductive member recedes toward the side of the other facet in the x-direction from the emission facet, and a receding portion is formed on the side of the other side face of the conductive member in the x-direction such that at least part of the conductive member recedes toward the emission facet side from the other facet in the x-direction, the conductive member comprises:

a main part; and an extended part extending in the x-direction and at least partly in a y-direction on a side of the surface electrode in two side faces opposed to each other in the x-direction in the main part, the y-direction being perpendicular to the x-direction and a z-direction, the z-direction being perpendicular to the semiconductor substrate, the receding portions, on the emission facet side and on the side of the other facet in the x-direction, including an extended part surface that is a surface on a side opposite to the semiconductor substrate in the extended part, and a side face of the main part connected to the extended part surface, the conductive member having a length in the x-direction shorter than a length of the semiconductor structure part in the x-direction, and the conductive member is flush with two side faces of the semiconductor structure part opposed to each other in the y-direction.

17. The semiconductor laser according to claim 16, wherein the conductive member in the whole of two side faces opposed to each other in the x-direction recedes toward respective opposite facet sides of the semiconductor structure part in the x-direction.

18. The semiconductor laser according to claim 16, wherein the conductive member is such that two side faces opposed to each other in the x-direction in at least part thereof in a y-direction recede toward respective opposite facet sides of the semiconductor part in the x-direction, the y-direction being perpendicular to the x-direction and a z-direction, the z-direction being perpendicular to the semiconductor substrate.

19. A semiconductor laser comprising:

a semiconductor substrate;

a semiconductor structure part that is formed on a surface of the semiconductor substrate and includes an active layer for generating light emitted from an emission facet;

a surface electrode formed on a surface of the semiconductor structure part opposite to the semiconductor substrate; and a conductive member formed on a surface of the surface electrode opposite to the semiconductor substrate, wherein the conductive member is such that part of or the whole of a side face thereof on an emission facet side, the side face being one side face in an x-direction parallel to an extending direction in which the active layer extends, is formed to be away from the emission facet in the semiconductor structure part toward a side of the other facet opposed to the emission facet in the x-direction, and a receding portion is formed in the conductive member such that at least part of the conductive member recedes toward the side of the other facet in the x-direction from the emission facet, the conductive member comprises:

a main part;

an extended part extending in the x-direction and at least partly in a y-direction on a side of the surface electrode in a side face of the emission facet side in the main part, the y-direction being perpendicular to the x-direction and a z-direction, the z-direction being perpendicular to the semiconductor substrate; and a groove passing through two side faces opposed to each other in the y-direction on a surface opposite to the semiconductor substrate or a groove extending from one side face in the y-direction toward a side of the other side face in the y-direction on the surface opposite to the semiconductor substrate, the receding portion including an extended part surface that is a surface on a side opposite to the semiconductor substrate in the extended part, and the side face of the main part connected to the extended part surface, a depth of the groove in the z-direction being equal to a depth of the receding portion in the z-direction.

20. The semiconductor laser according to claim 19, wherein a length of the conductive member in the x-direction is shorter than a length of the semiconductor structure part in the x-direction.

21. The semiconductor laser according to claim 19, wherein the conductive member includes:

a first plating layer constituting a layer from a rear surface of the conductive member on a side of the semiconductor substrate up to a position of the extended part surface of the receding portion and a bottom surface of the groove on the semiconductor substrate side; and a second plating layer constituting a layer from a position of the extended part surface and the bottom surface of the groove up to a surface of the main part opposite to the semiconductor substrate.

22. The semiconductor laser according to claim 19, wherein the conductive member is a plating layer, and the receding portion and the groove are recesses formed in the plating layer.

23. The semiconductor laser according to claim 19, wherein the conductive member is formed such that the main part encompasses the active layer.

24. The semiconductor laser according to claim 19, wherein the receding portion passes through two side faces opposed to each other in the y-direction.

25. A semiconductor laser comprising:

a semiconductor substrate;

a semiconductor structure part that is formed on a surface of the semiconductor substrate and includes an active layer for generating light emitted from an emission facet;

a surface electrode formed on a surface of the semiconductor structure part opposite to the semiconductor substrate; and a conductive member formed on a surface of the surface electrode opposite to the semiconductor substrate, wherein the conductive member is such that part of or the whole of a side face thereof on an emission facet side, the side face being one side face in an x-direction parallel to an extending direction in which the active layer extends, is formed to be away from the emission facet in the semiconductor structure part toward a side of the other facet opposed to the emission facet in the x-direction, part of or the whole of a side face thereof on a side of the other facet in the x-direction is formed toward the emission facet side, a receding portion is formed on the emission facet side of the conductive member such that at least part of the conductive member recedes toward the side of the other facet in the x-direction from the emission facet, and a receding portion is formed on the side of the other side face of the conductive member in the x-direction such that at least part of the conductive member recedes toward the emission facet side from the other facet in the x-direction, the conductive member comprises:

a main part;

an extended part extending in the x-direction and at least partly in a y-direction on a side of the surface electrode in two side faces opposed to each other in the x-direction in the main part, the y-direction being perpendicular to the x-direction and a z-direction, the z-direction being perpendicular to the semiconductor substrate; and a groove passing through two side faces opposed to each other in the y-direction on a surface opposite to the semiconductor substrate or a groove extending from one side face in the y-direction toward a side of the other side face in the y-direction on the surface opposite to the semiconductor substrate, the receding portions, on the emission facet side and on the side of the other facet in the x-direction, including an extended part surface that is a surface on a side opposite to the semiconductor substrate in the extended part, and a side face of the main part connected to the extended part surface, a depth of the groove in the z-direction being equal to a depth of the receding portion in the z-direction.

* * * * *